(12) United States Patent
Suh et al.

(10) Patent No.: US 7,518,140 B2
(45) Date of Patent: Apr. 14, 2009

(54) FLAT PANEL DISPLAY AND METHOD OF FABRICATING THE SAME

(75) Inventors: Min-Chul Suh, Suwon-si (KR); Taek Ahn, Suwon-si (KR); Yong-Woo Park, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 181 days.

(21) Appl. No.: 11/480,549

(22) Filed: Jul. 5, 2006

(65) Prior Publication Data

US 2007/0007515 A1 Jan. 11, 2007

(30) Foreign Application Priority Data

| Jul. 6, 2005 | (KR) | ................ 10-2005-0060713 |
| Jul. 6, 2005 | (KR) | ................ 10-2005-0060715 |
| Jul. 6, 2005 | (KR) | ................ 10-2005-0060716 |

(51) Int. Cl.
    *H01L 29/08* (2006.01)
(52) U.S. Cl. ................ 257/40; 257/E31.126
(58) Field of Classification Search ............ 257/40; 438/99

See application file for complete search history.

(56) References Cited

U.S. PATENT DOCUMENTS

| 6,316,098 B1* | 11/2001 | Yitzchaik et al. ........... 428/339 |
| 6,908,796 B2* | 6/2005 | Furusawa ................... 438/149 |
| 6,958,490 B2* | 10/2005 | Okamoto et al. ............. 257/40 |
| 2002/0033918 A1* | 3/2002 | Shigeno et al. ............ 349/114 |
| 2003/0193284 A1* | 10/2003 | Park et al. ................... 313/504 |
| 2004/0239838 A1* | 12/2004 | Lai ............................ 349/106 |
| 2005/0247928 A1* | 11/2005 | Unno .......................... 257/40 |
| 2006/0160277 A1* | 7/2006 | Sirringhaus et al. ........ 438/149 |

FOREIGN PATENT DOCUMENTS

| KR | 2003-0081955 | 10/2003 |
| KR | 10-2005-0051072 | 6/2005 |

OTHER PUBLICATIONS

Korean Office Action for corresponding Korean Patent Application No. 2005-0060715, issued on Oct. 13, 2006.

\* cited by examiner

*Primary Examiner*—Wai-Sing Louie
*Assistant Examiner*—Bilkis Jahan
(74) *Attorney, Agent, or Firm*—Robert E. Bushnell, Esq.

(57) ABSTRACT

A flat panel display apparatus includes a gate insulating layer having openings which define pixels. The flat panel display apparatus includes: a substrate; a source electrode and a drain electrode formed on the substrate; a semiconductor layer contacting the source electrode and the drain electrode; a gate formed on the substrate; an insulating layer formed between the source and drain electrodes and the gate, and including an opening; and a pixel electrode partially exposed by the opening of the insulating layer. The insulating layer acts as a gate insulating layer and a pixel definition layer defining the pixel electrode.

22 Claims, 17 Drawing Sheets

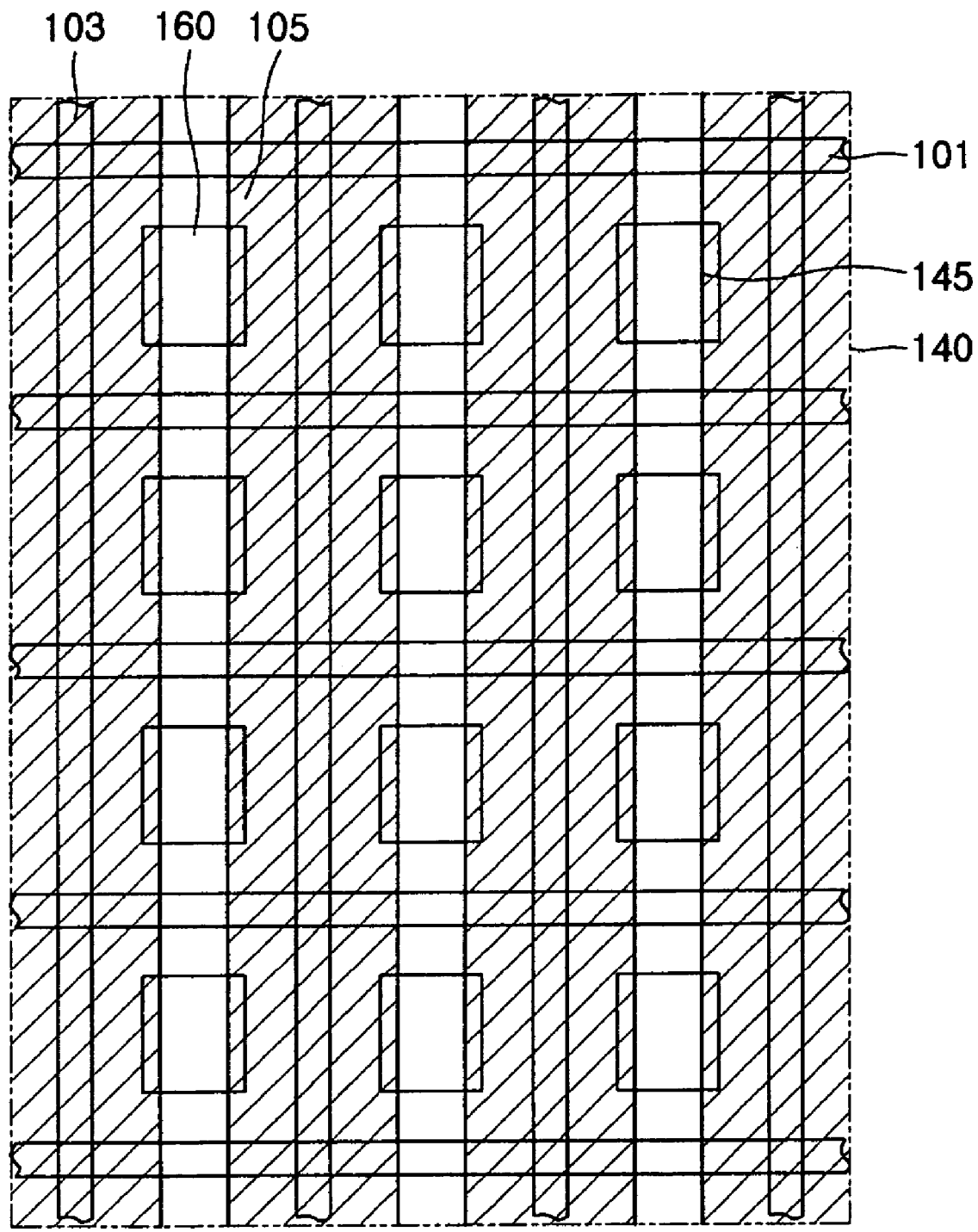

FLAT PANEL DISPLAY AND METHOD OF FABRICATING THE SAME

CLAIM OF PRIORITY

This application makes reference to, incorporates the same herein, and claims all benefits accruing under 35 U.S.C.§119 from three applications, entitled FLAT PANEL DISPLAY, FLAT PANEL DISPLAY AND METHOD FOR FABRICATING THE SAME, and FLAT PANEL DISPLAY AND METHOD FOR FABRICATING THE SAME, all of which were earlier filed in the Korean Intellectual Property Office on the 6 of Jul. 2005 and there, duly assigned Serial Nos. 10-2005-0060713, 10-2005-0060715 and 10-2005-0060716, respectively.

BACKGROUND OF THE INVENTION

1. Technical Field

The present invention relates to a flat panel display and, more particularly, to an organic electroluminescence (EL) display apparatus including a gate insulating layer having an opening defining pixels, and a method of fabricating the organic EL display apparatus.

2. Related Art

Flexible organic electroluminescence (EL) display apparatuses generally used include a flexible substrate such as a plastic substrate. The plastic substrate is not very heat-resistant, and thus, the flexible organic EL display apparatuses should be fabricated at a low temperature. Organic thin film transistors (OTFTs) which can operate at a low temperature can be used as switching devices in the flexible organic EL display apparatuses. The OTFTs have been actively researched as possible driving devices in next generation display apparatuses. Instead of a silicon layer, OTFTs use an organic layer as a semiconductor layer instead of using a silicon layer. The OTFTs can be classified into low polymer OTFTs such as oligothiophene and pentacene, and high polymer OTFTs such as polythiophene, according to organic material.

Organic EL display apparatuses can be classified as back emission type apparatuses, front emission type apparatuses, and dual emission type apparatuses according to the light emission path from organic layers. In the back emission type organic EL display apparatuses, the light emitted from an organic light emitting layer is radiated toward the substrate. In the front emission type organic EL display apparatuses, the light emitted from the organic light emitting layer is radiated in the opposite direction away from the substrate. In addition, in the dual emission type organic EL display apparatuses, the light emitted from the organic light emitting layer is radiated both toward and away from the substrate and in an opposite direction relative to the substrate.

The organic EL display apparatus, including the OTFT according to the conventional art, includes: a thin film transistor (TFT) including source and drain electrodes, a semiconductor layer, and a gate on a substrate; a protective layer on the TFT; and an organic light emitting device including a lower electrode, an organic layer, and an upper electrode on the protective layer. A gate insulating layer is formed between the source and drain electrodes and the gate. The lower electrode is connected to one of the source and drain electrodes of the TFT through a via hole formed in the protective layer. A pixel separation layer includes an opening exposing a portion of the lower electrode. The organic layer is formed on the exposed lower electrode in the opening, and then the upper electrode is formed on the organic layer.

A method of fabricating an organic EL display apparatus having the above structure includes: forming the TFT including the source and drain electrodes, the semiconductor layer, and the gate; forming the protective layer; forming the via hole using a mask; forming the lower electrode connected to the TFT through the via hole on the protective layer; forming the opening exposing the lower electrode; and forming the organic layer and the upper electrode. These above processes for fabricating the organic EL display apparatus are very complex.

SUMMARY OF THE INVENTION

The present invention provides a flat panel display apparatus including a gate insulating layer which is used as a pixel separation layer.

The present invention also provides a method of fabricating a flat panel display apparatus in which a gate insulating layer having an opening defining pixels is formed using a laser ablation method.

The present invention also provides a method of fabricating a flat panel display apparatus in which a gate insulating layer having an opening defining pixels is formed using an ink-jet method.

The present invention also provides a method of fabricating a flat panel display apparatus in which a gate insulating layer having an opening defining pixels is formed using a laser induced thermal image method.

According to an aspect of the present invention, a flat panel display apparatus comprises: a substrate; a source electrode and a drain electrode formed on the substrate; a semiconductor layer contacting the source electrode and the drain electrode; a gate formed on the substrate; an insulating layer formed between the source and drain electrodes and the gate, and including an opening; and a pixel electrode, a part of which is partially exposed by the opening of the insulating layer.

The semiconductor layer preferably includes an organic semiconductor material, the source electrode and the drain electrode are formed of different materials from each other, and the pixel electrode extending from one of the source electrode and the drain electrode is formed of the same material as that of the source electrode or the drain electrode. The source electrode or the drain electrode is a transparent electrode formed of a material selected from the group consisting of indium tin oxide (ITO), indium zinc oxide (IZO), ZnO, and $In_2O_3$, or a reflective electrode including a stacked layer formed of a reflective material selected from the group consisting of Ag, Mg, Al, Pt, Pd, Au, Ni, Nd, Ir, Cr, and a compound thereof, and a transparent conductive material selected from the group consisting of ITO, IZO, ZnO, and $In_2O_3$. The other one of the source electrode and the drain electrode is preferably formed of a conductive material selected from the group consisting of Au, Pd, and Pt so as to have an electrode material for matching a work function higher than the semiconductor layer.

The semiconductor layer may also be formed of material which includes an organic semiconductor material, and the pixel electrode is connected to the source electrode or the drain electrode, and is formed of a material different from that of the source and drain electrodes. The source electrode and the drain electrode may be formed of an electrode material selected from the group consisting of Au, Pd, and Pt so as to have a work function higher than that of the semiconductor layer. The pixel electrode may be a transparent electrode formed of a material selected from the group consisting of indium tin oxide (ITO), indium zinc oxide (IZO), ZnO, and In$_2$O$_3$, or a reflective electrode including a stacked layer formed of a reflective material selected from the group consisting of Ag, Mg, Al, Pt, Pd, Au, Ni, Nd, Ir, Cr and a compound thereof, and a transparent conductive material selected from the group consisting of ITO, IZO, ZnO, and In$_2$O$_3$.

The semiconductor layer may also be formed of an organic semiconductor material, the source electrode and the drain electrode being formed of different materials from each other, and the pixel electrode may include: a reflective layer extending from one of the source electrode and the drain electrode; and a transparent electrode layer overlapping the reflective layer. The reflective layer of the pixel electrode and the source electrode or the drain electrode may be formed of a material selected from the group consisting of Ag, Mg, Al, Pt, Pd, Au, Ni, Nd, Ir, Cr, and a compound of these materials, and the transparent electrode layer is formed of a material selected from the group consisting of ITO, IZO, ZnO, and In$_2$O$_3$. The other of the source electrode and the drain electrode may be formed of a conductive material selected from the group consisting of Au, Pd, Pt, MoW oxide, and polyethylenedioxythiophene (PEDOT) so as to have work function higher than that of the semiconductor layer.

The insulating layer may be an organic insulating layer, an inorganic insulating layer, or an organic-inorganic hybrid layer, and the insulating layer may be formed as a single layer or a multi-layer. The insulating layer may be formed of a material selected from a group consisting of SiO$_2$, SiNx, Al$_2$O$_3$, Ta$_2$O$_5$, BST, PZT, polystyrene (PS), phenol-based polymer, acryl-based polymer, imide-based polymer such as polyimide, arylether-based polymer, amide-based polymer, fluoride-based polymer, p-xylene based polymer, vinyl alcohol-based polymer, and parylene.

The insulating layer can absorb a laser, and may be formed of a material selected from a group consisting of SiO$_2$, polyimide, poly vinyl phenol (PVP), parylene, and PI/Al$_2$O$_3$. The insulating layer may be formed of a material selected from a group consisting of polyvinyl alcohol (PVA), polyvinyl chloride (PVC), poly methylmethacrylate (PMMA), and a fluoride-based polymer material which is mixed with a chromophore having a band for absorbing a laser beam wavelength or which is a copolymer. The insulating layer may contain 0.005 wt % of the chromophore in the insulating layer.

The insulating layer may be formed of a material, which can be formed using an inkjet method, and is selected from a group consisting of PI/Al$_2$O$_3$, polyimide, PVP, parylene, PVA, PVC, PMMA.

The insulating layer may be formed of a material which can be transferred by laser, and the material may be obtained by mixing two or more kinds of polymers, or a low-molecular material with a polymer. The polymer may be one of polyimide, PVP, PVA, PVC, PMMA, parylene, and polystyrene, and the low-molecular material is zirconia or alumina. The polymer and the low-molecular material may be mixed at a ratio of 1:1-1:3. The sum of the thicknesses of the semiconductor layer and the source and drain electrodes may be less than 5000 Å. The sum of the thicknesses of the semiconductor layer and the source and drain electrodes may be 2000-3000 Å.

The openings of the insulating layer may be arranged so as to form a mesh exposing a part of the pixel electrode arranged in each of the pixel regions, or as lines parallel to the gate lines or the data lines so as to expose a part of the pixel electrode in each of the pixel regions arranged along the gate lines or exposing a part of the pixel electrode in each of the pixel regions arranged along the data lines.

According to another aspect of the present invention, a method of fabricating a flat panel display apparatus comprises: forming a source electrode, a drain electrode, a pixel electrode, and a semiconductor layer contacting the source electrode and the drain electrode on a substrate; forming an insulating layer including openings exposing a part of the pixel electrode; and forming a gate on a portion of the insulating layer which corresponds to the semiconductor layer.

The forming of the insulating layer may include: depositing an insulating material which can absorb laser energy on an entire surface of the substrate; and etching a portion of the insulating material corresponding to the opening using a laser ablation process. The forming of the insulating layer may include applying an insulating material on the entire substrate, except for a portion of the substrate corresponding to the opening, using an inkjet method. The treating of the surface of the substrate is performed by treating a portion of the surface of the substrate corresponding to the opening using Ar and O$_2$ plasma, or treating the entire surface of the substrate except for the portion of the substrate corresponding to the opening using a fluoride-based plasma such as CF$_4$ or C$_3$F$_8$.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 2A thru 2C are plan views of patterns of an opening in a gate insulating layer of the organic EL display apparatus according to the present invention;

DETAILED DESCRIPTION OF THE INVENTION

Figure 1:
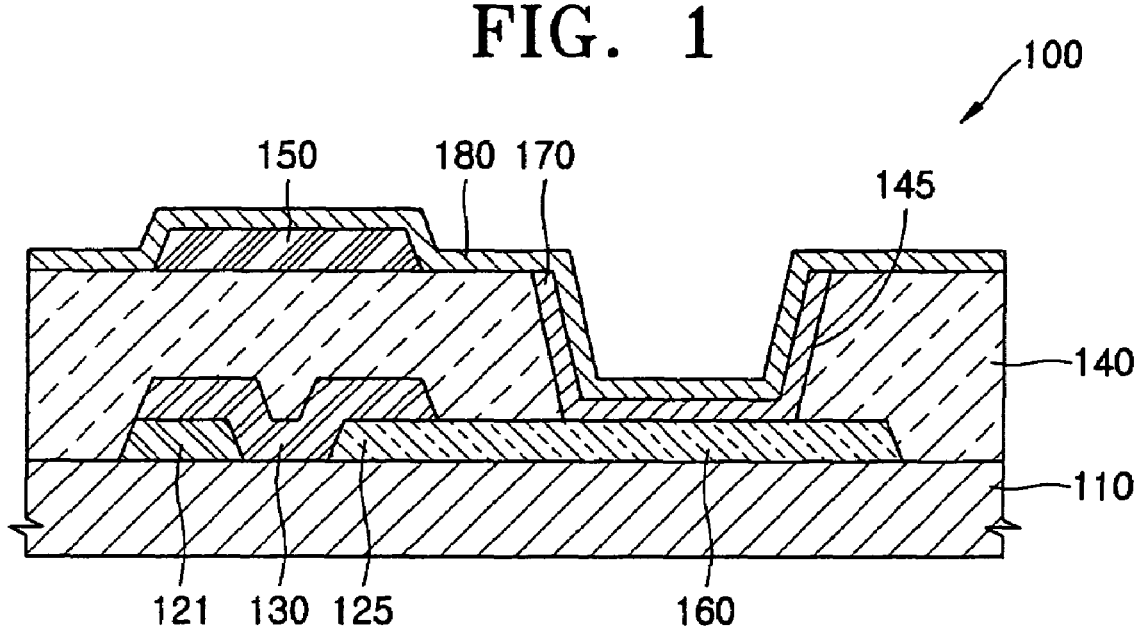
FIG. 1 is a cross-sectional view of an organic electroluminescence (EL) display apparatus according to an embodiment of the present invention.

FIG. 1 is a cross-sectional view of an organic electroluminescence (EL) display apparatus according to an embodiment of the present invention.

The organic EL display apparatus 100 includes a plurality of pixels arranged in a matrix on a substrate. Each of the pixels includes thin film transistors (TFTs), for example, a switching TFT and a driving TFT, a capacitor, and an organic EL device. FIG. 1 illustrates an organic EL device, and a driving TFT for driving the organic EL device.

Referring to FIG. 1, a source electrode 121 and a drain electrode 125 are formed on a substrate 110, and a lower electrode 160 extends from one of the source electrode 121 and the drain electrode 125, for example, from the drain electrode 125. The lower electrode 160 acts as a pixel electrode in each of the pixels. A semiconductor layer 130 contacts the source 121 and drain electrode 125, respectively.

An insulating layer 140 is formed on the substrate 110, and a gate 150 is formed on the insulating layer 140. The insulating layer 140 includes an opening 145 corresponding to the lower electrode 160, thus acting as a pixel separation layer defining the lower electrode 160, and acts as a gate insulating layer in a region below the gate 150.

An organic layer 170 is formed on the lower electrode 160 in the opening 145, and an upper electrode 180 is formed over the entire substrate 110. The organic layer 170 may include one or more organic layers selected from a hole insertion layer, a hole transport layer, a light emitting layer, an electron transport layer, an electron insertion layer, and a hole restraint layer. In the present embodiment, the organic layer 170 is formed in the opening 145 of the insulating layer 140, but the present invention is not limited thereto. The light emitting layer (not shown) may be formed in the opening 145 and separated from the light emitting layers of the neighboring pixels, and the charge transport layer, that is, a common layer, may be formed over the entire substrate 110.

The substrate 110 may be a glass plate, a plastic substrate, or a metal substrate. The metal substrate may be a steel use stainless (SUS) substrate. The plastic substrate may be composed of plastic selected from the group consisting of polyethersulphone (PES), polyacrylate (PAR), polyetherimide (PEI), polyethyelene napthalate (PEN), polyethyelene-terepthalate (PET), polyphenylene sulfide (PPS), polyallylate, polyimide, polycarbonate (PC), cellulose triacetate (TAC), and cellulose acetate propinonate (CAP).

The semiconductor layer 130 may be an organic semiconductor layer formed of a material selected from the group consisting of pentacene, tetracene, anthracene, naphthalene, alpha-6-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, polythiophene and derivatives thereof, polyparaperylenevinylene and derivatives thereof, polyflorene and derivatives thereof, polythiophenevinylene and derivatives thereof, polyparaphenylene and derivatives thereof, polythiophene-heteroring aromatic copolymer and derivatives thereof, oligophthalene and derivatives thereof, alpha-5-thiophene oligothiophene and derivatives thereof, phthalocyanine containing metal or not containing metal and derivatives thereof, pyromellitic dianhydride and derivatives thereof, pyromellitic diimide and derivatives thereof, perylenetetracarboxylic acid dianhydride and derivatives thereof, naphthalene tetracarboxylic acid diimide and derivatives thereof, and naphthalene tetracarboxylic acid dianbydride and derivatives thereof. The semiconductor layer 130 includes a silicon layer, such as an amorphous silicon layer or a polycrystalline silicon layer, and may include source/drain regions that are doped with highly concentrated impurities and contact the source electrode 121 and drain electrode 125, respectively.

The insulating layer 140 may be an inorganic insulating layer, an organic insulating layer, or an inorganic-organic hybrid layer, and may be formed as a single layer or a multilayer. The inorganic insulating layer may be formed of a material selected from the group consisting of $SiO_2$, $SiN_x$, $Al_2O_3$, $Ta_2O_5$, BST, and PZT. The organic insulating layer includes one or more organic insulating layers formed of materials selected from the group consisting of PS(polystyrene), phenol-based polymer, acryl-based polymer, imide-based polymer such as polyimide, arylether-based polymer, amide-based polymer, fluoride-based polymer, p-xylene based polymer, vinyl alcohol-based polymer, and parylene.

In addition, the insulating layer 140 may be formed of a material which can be ablated by a laser. The insulating layer 140 may be formed of a material which can absorb laser energy, for example, $SiO_2$, $PI/Al_2O_3$ or an aromatic material, that is, a material including a functional group having benzene, for example, polyimide, poly vinyl phenol (PVP), or parylene. The insulating layer 140 may be formed of a material that does not absorb laser energy, for example, polyvinyl alcohol (PVA), polyvinyl chloride (PVC), poly methylmethacrylate (PMMA), or a fluoride-based polymer material. In this case, the material is mixed with 0.005 wt % or more of a chromophore having a band for absorbing the laser beam wavelength, or an insulating copolymer can be used.

The insulating layer 140 may be formed of a material which can be printed in an inkjet printing operation. The insulating layer may be formed of a material selected from the group consisting of $PI/Al_2O_3$, polyimide, PVP, parylene, PVA, PVC, and PMMA.

Otherwise, the insulating layer 140 can be formed using a laser induced thermal image (LITI) method, and can be formed of a common polymer, for example, polyimide, PVP, PVA, PVC, PMMA, parylene, or polystyrene. Since the insulating layer 140 should cause a phase separation for the LITI process, two different kinds of common polymers can be mixed, or a low-molecular material such as zirconia or alumina can be mixed with the common polymer. The low-molecular material may be mixed with the common polymer in a ratio of 1:1-3:1. In addition, the semiconductor layer 130 and the source and drain electrodes 121 and 125, respectively, should have a combined thickness of less than 5000 Å in order to perform the LITI process sufficiently. For example, the total thickness of the semiconductor layer 130 and the source and drain electrodes 121 and 125, respectively, may be 2000-3000 Å.

In the organic EL display apparatus 100, the source electrode 121 and the drain electrode 125 are formed of different materials. To obtain a low contact resistance between the source electrode 121 and the semiconductor layer 130, the source electrode 121 can be formed of a material having a work function dependent on the semiconductor layer 130. That is, the source electrode 121 can include an electrode material having a greater work function than that of the organic semiconductor layer 130 and a metal electrode material selected from Au, Pt, and Pd.

In addition, a portion of the drain electrode 125 which is exposed by the insulating layer 140 acts as a lower electrode 160, that is, an anode electrode, and thus, the drain electrode 125 may include a lower electrode material. For example, if the organic EL display apparatus 100 has a back emission structure, the lower electrode 160 may be a transparent electrode. The lower electrode 160 may be composed of a transparent conductive material such as ITO, IZO, ZnO, or $In_2O_3$. If the organic EL display apparatus has a front emission structure, the lower electrode 160 may be a reflective electrode, and thus the lower electrode 160 may include a transparent conductive layer and a reflective layer having high reflectivity under the transparent conductive layer. The transparent conductive layer may be formed of ITO, IZO, ZnO, or $In_2O_3$, and the reflective layer may be formed of Ag, Mg, Al, Pt, Pd, Au, Ni, Nd, Ir, Cr or a compound thereof.

If the organic EL display apparatus 100 is a back emission type device, the upper electrode 180 may be a reflective electrode formed of Li, Ca, LiF/Ca, LiF/Al, Al, Mg, or a compound thereof. If the organic EL display apparatus is a front emission type device, the upper electrode 180 may be a transparent electrode having a stacked structure in which a metal layer and a transparent conductive layer are stacked. The metal layer may be formed of Li, Ca, LiF/Ca, LiF/Al, Al, Mg, or a compound thereof, and the transparent conductive layer may be formed of ITO, IZO, ZnO, or $In_2O_3$.

Figure 2A:
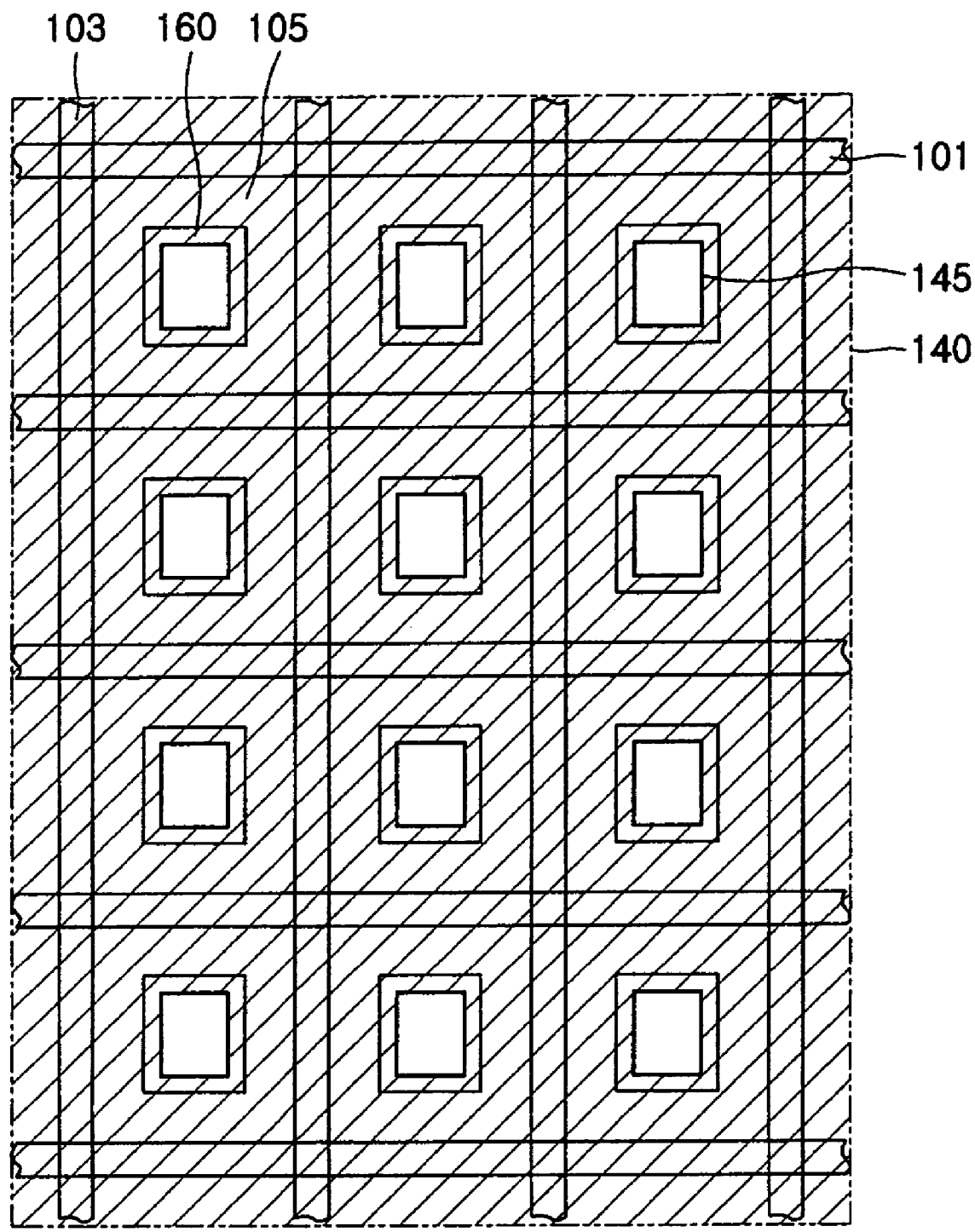
Figure 2C:
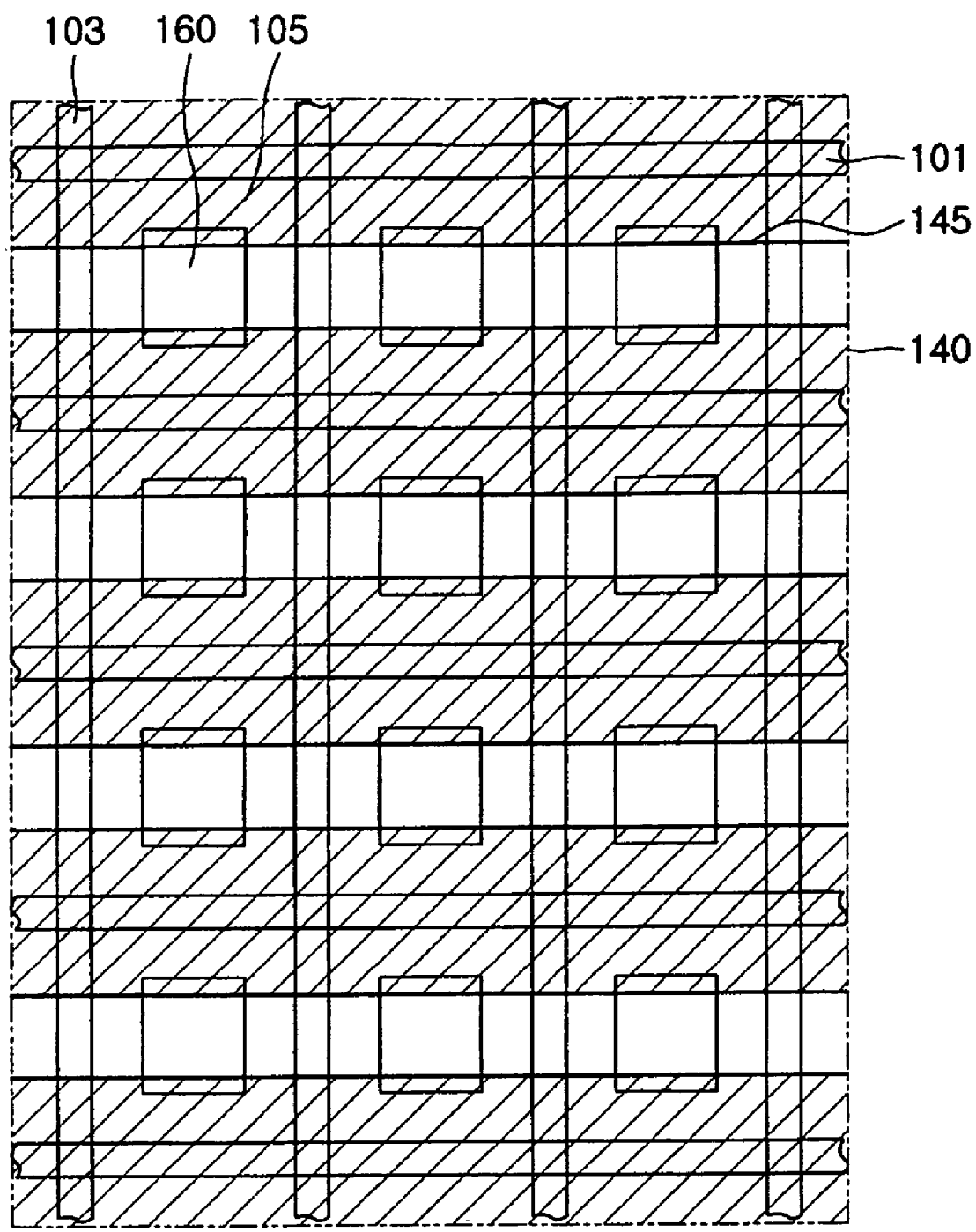

FIGS. 2A thru 2C illustrate examples of patterns of an opening in the insulating layer of the organic EL display apparatus according to the present invention.

In the organic EL display apparatus 100, a plurality of gate lines 101 and a plurality of data lines 103, defining a plurality of pixel regions 105, are arranged on the substrate 110. Each of the pixel regions 105 includes an organic EL device having the lower electrode 160, that is, the pixel electrode, and a TFT for driving the organic EL device. In addition, power lines (not shown) for supplying voltages cross the gate lines 101, and are parallel to the data lines 103.

In the embodiment shown in FIG. 2A, the insulating layer 140 is formed on the substrate 110, and the openings 145 of the insulating layer 140 form a mesh exposing some parts of the pixel electrodes 160 arranged on the pixel regions 105. In the embodiment shown in FIG. 2B, the openings 145 of the insulating layer 140 form lines parallel to the data lines 103 so as to expose some parts of the pixel electrodes 160. In the embodiment shown in FIG. 2C, the openings 145 of the insulating layer 140 form lines parallel to the gate lines 101 so as to expose some parts of the pixel electrodes 160.

FIGS. 3A thru 3D are cross-sectional views illustrating a method of fabricating the organic EL display apparatus shown in FIG. 1 using a laser ablation method according to an embodiment of the present invention.

Figure 3A:
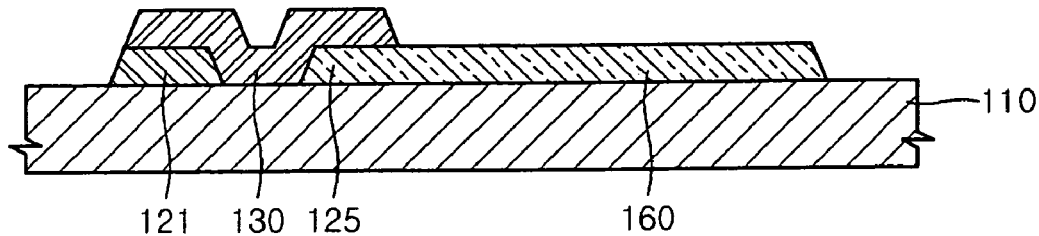
FIGS. 3A thru 3D are cross-sectional views illustrating a method of fabricating the organic EL display apparatus shown in FIG. 1 using a laser ablation method according to an embodiment of the present invention.

Referring to FIG. 3A, the source electrode 121 and the drain electrode 125 are formed on the substrate 110, and the semiconductor layer 130 is formed so as to contact the source and drain electrodes 121 and 125, respectively. A portion 160 of the drain electrode 125 acts as the pixel electrode. The drain electrode 125 can be formed after forming the source electrode 121, or the source electrode 121 can be formed after forming the drain electrode 125.

Figure 3B:
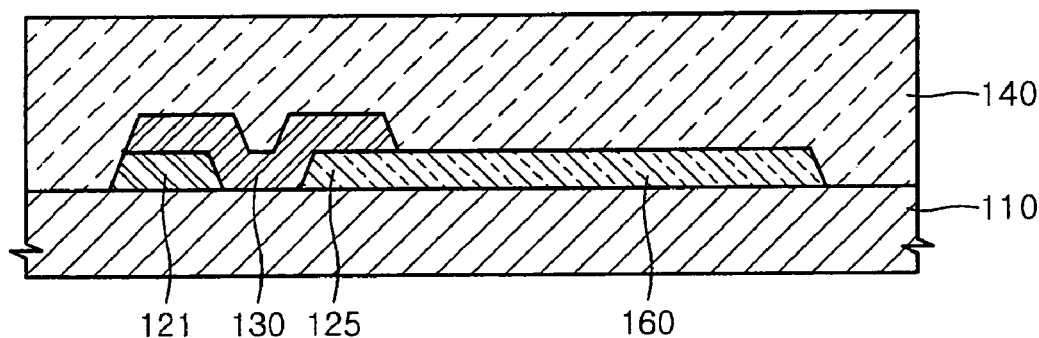

Referring to FIG. 3B, the gate insulating layer 140 is formed on the substrate 110. The gate insulating layer 140 may be an inorganic insulating layer, an organic insulating layer, or an inorganic-organic hybrid layer which can absorb a laser, and is formed as a single layer or a multi-layer. The gate insulating layer 140 may be formed of a material such as $SiO_2$, polyimide, PVP (poly vinyl phenol), parylene, or $PI/Al_2O_3$. If the material is, for example, polyvinyl alcohol (PVA), polyvinyl chloride (PVC), poly methylmethacrylate (PMMA), or fluoride-based polymer material, and thus does not absorb laser energy, 0.005 wt % or more of chromophore having a band for absorbing a laser beam wavelength can be mixed in the material, or an insulating material of copolymer can be used.

Figure 3C:
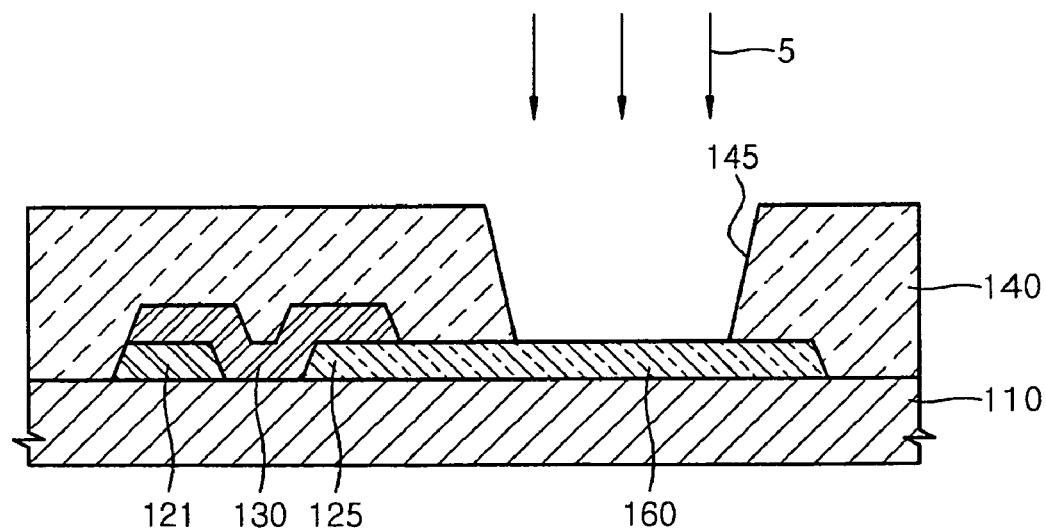

Referring to FIG. 3C, a laser beam 5 is radiated onto a portion of the gate insulating layer 140 which corresponds to the drain electrode 125 using the laser ablation method. The gate insulating layer 140 is thus etched to form the openings 145. The gate insulating layer 140 has the openings 145 as shown in FIGS. 2A thru 2C. The portion of the drain electrode 125 exposed through the opening 145 of the gate insulating layer 140 becomes the lower electrode 160, that is, the anode electrode.

The laser (not shown) used to generate the laser beam 5 is an excimer laser. The excimer laser generates light having a wavelength of 248 nm or 308 nm. When the gate insulating layer 140 absorbs the light with a wavelength of 248 nm or 308 nm, the laser ablation process is performed. In this regard, the gate insulating layer 140 may absorb at least 0.005% of the laser beam wavelength. In the present embodiment, the laser beam 5 is produced by an excimer laser, but the invention is not limited thereto. In addition, the opening 145 of the insulating layer 140 can be formed using a photolithography process instead of the laser ablation method.

Figure 3D:
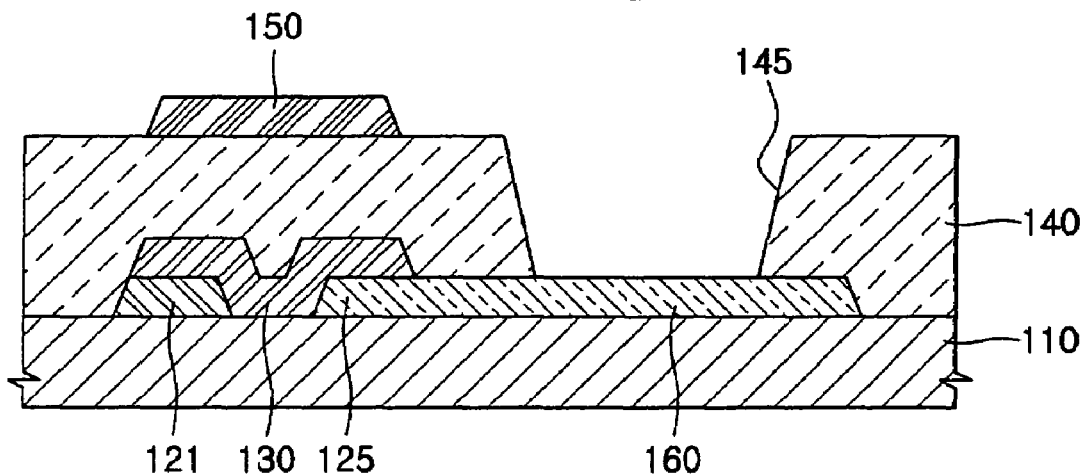

Referring to FIG. 3D, the gate 150 is formed on a portion of the insulating layer 140 corresponding to the semiconductor layer 130. In addition, the organic layer 170 and the upper electrode 180 are formed on the substrate 110.

FIGS. 4A thru 4D are cross-sectional views illustrating a method of fabricating the organic EL display apparatus shown in FIG. 1 using an inkjet method according to an embodiment of the present invention.

Figure 4A:
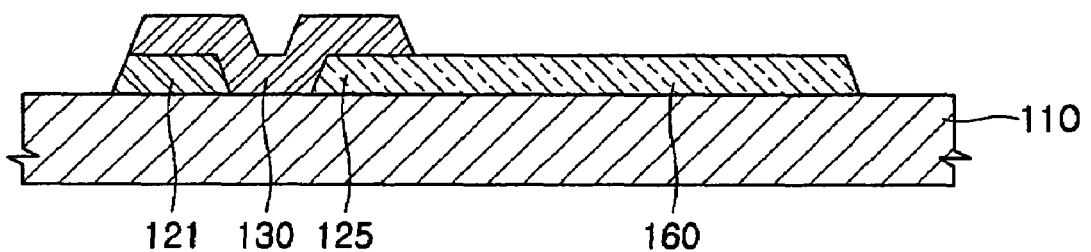
FIGS. 4A thru 4D are cross-sectional view illustrating a method of fabricating the organic EL display apparatus shown in FIG. 1 using an ink-jet method according to an embodiment of the present invention.
Figure 4B:
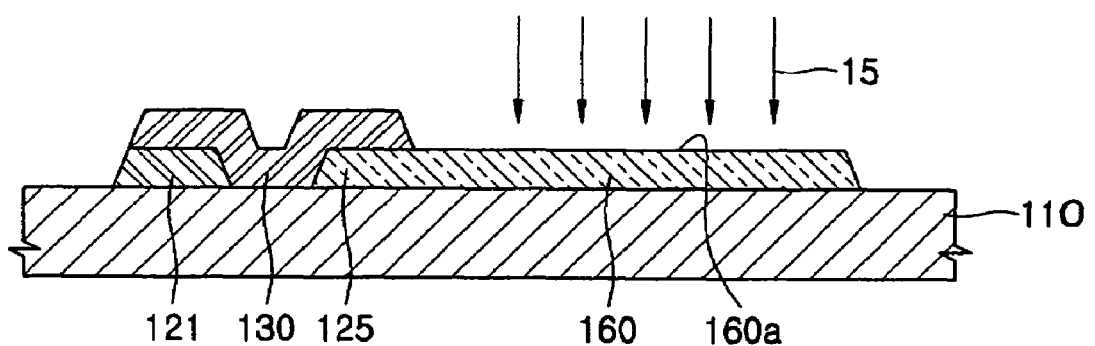

Referring to FIG. 4A, the source electrode 121 and the drain electrode 125 are formed on the substrate 110, and the semiconductor layer 130 is formed so as to contact the source electrode 121 and the drain electrode 125. Referring to FIG. 4B, a surface of the lower electrode 160 extending from one of the source electrode 121 and drain electrode 125, respectively, for example, from the drain electrode 125, is subjected to a surface treatment. The surface treatment is performed using fluoride-based plasma to make the surface 160a hydrophobic. The surface treatment using the fluoride-based plasma can be performed with a fluoride-based gas such as $CF_4$ or $C_3F_8$.

Figure 4C:
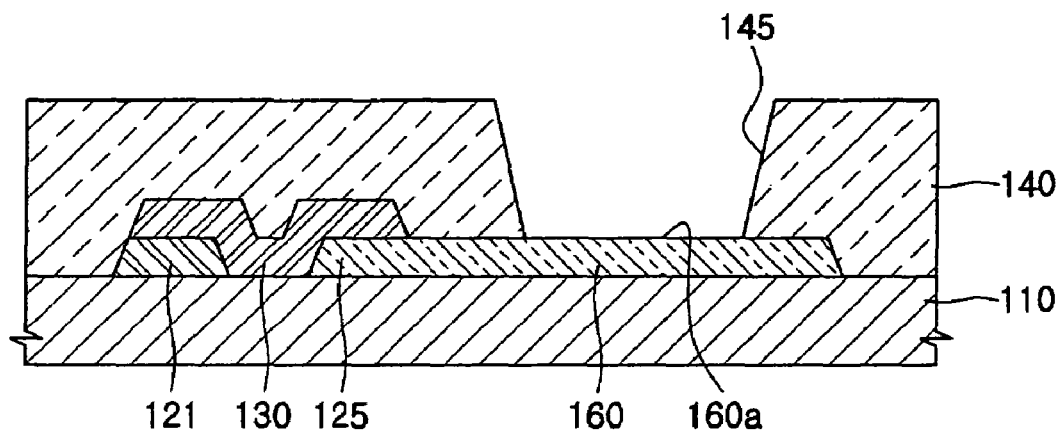

Referring to FIG. 4C, a solution including an insulating material for forming the gate insulating layer 140 is discharged from an inkjet head (not shown) onto the substrate 110, thereby forming the gate insulating layer 140. The gate insulating layer 140 is not formed on the surface-treated portion 160a of the lower electrode 160, and thus an opening 145 exposing the lower electrode 160 can be formed.

The gate insulating layer 140 has the openings 145 shown in FIGS. 2A thru 2C, and the lower electrode 160 acts as a pixel electrode. The gate insulating layer 140 is formed of a material selected from the group consisting of $PI/Al_2O_3$, polyimide, poly vinyl phenol (PVP), parylene, polyvinyl alcohol (PVA), polyvinyl chloride (PVC), poly methylmethacrylate (PMMA).

If the surface of the substrate 110 and the ink are not adhered firmly, that is, if the surface of the substrate 110 is hydrophobic, the surface of the substrate 110 excluding the portion corresponding to the opening 145 exposing a part of the drain electrode 125, that is, the lower electrode 160, can be treated to form the gate insulating layer 140 having the opening 145. That is, the entire surface excluding the surface 160a of the drain electrode 125, which corresponds to the opening 145, can be treated using Ar and $O_2$ plasma so that the surface of the substrate 110 is hydrophilic. The ink including the gate insulating material is discharged onto the substrate 110, and thus, the gate insulating layer 140 can be coated on the surface treated portion. Therefore, the gate insulating layer 140 is not formed on the surface 160a of the drain electrode 125, which is not treated with the plasma.

Figure 4D:
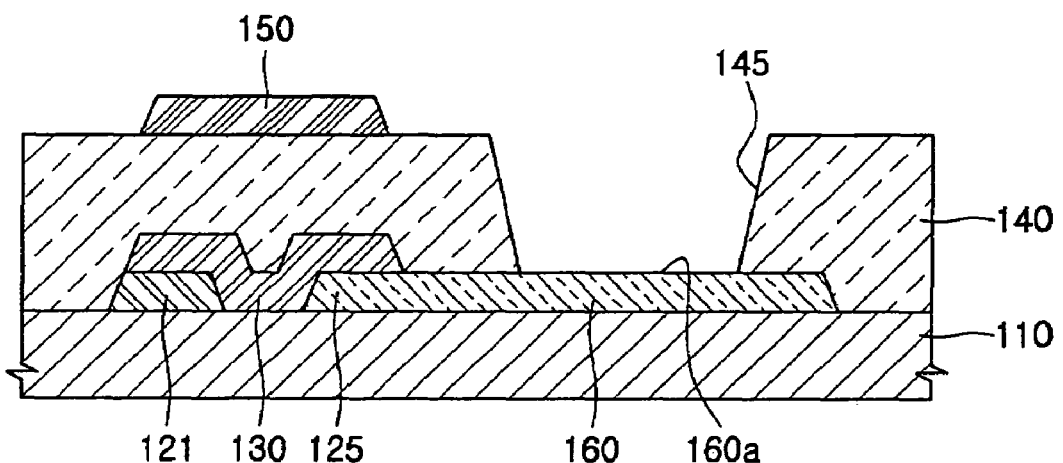

Referring to FIG. 4D, the gate 150 is formed on a portion of the gate insulating layer 140 above the semiconductor layer 130. In addition, the organic layer 170 and the upper electrode 180 are formed on the substrate 110, thus completing fabrication of the organic EL display apparatus 100.

FIGS. 5A thru 5D are cross-sectional views illustrating a method of fabricating the organic EL display apparatus shown in FIG. 1 using a laser inducted thermal image method according to an embodiment of the present invention.

Figure 5A:
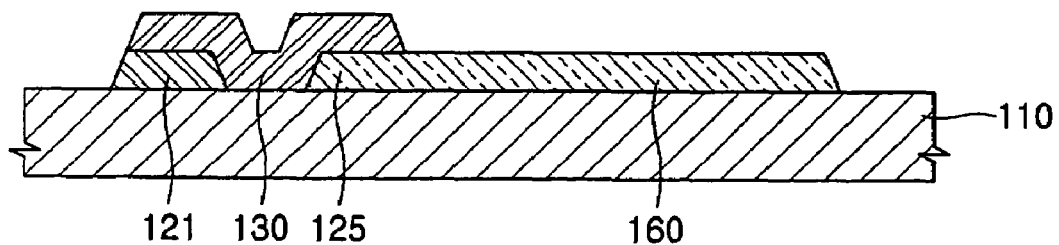
FIGS. 5A thru 5D are cross-sectional views illustrating a method of fabricating the organic EL display apparatus shown in FIG. 1 using a laser induced thermal image method according to an embodiment of the present invention.
Figure 5B:
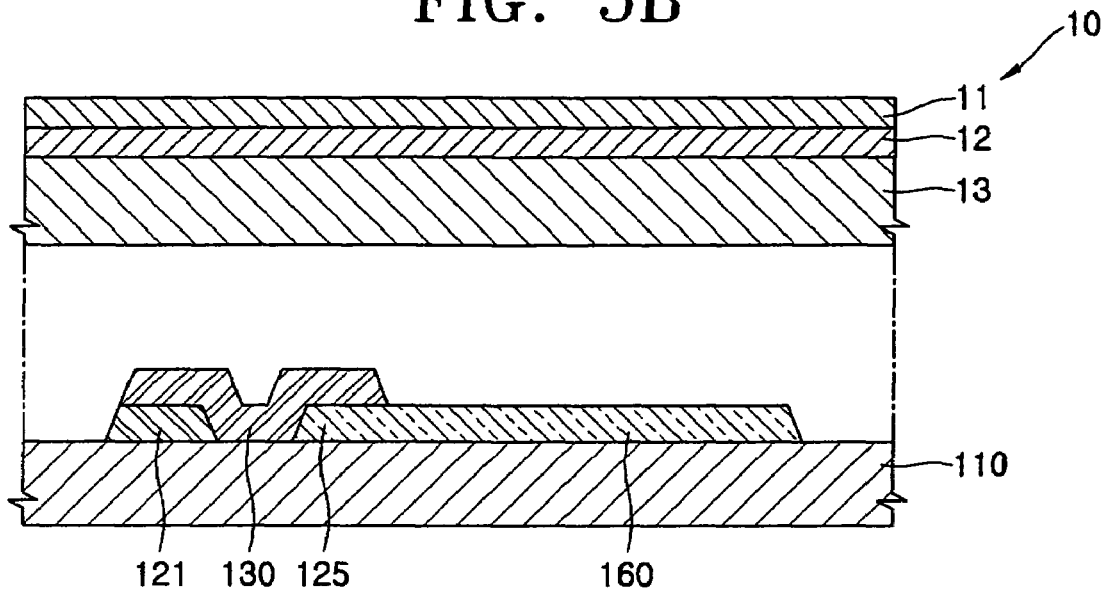

Referring to FIG. 5A, a source electrode 121 and a drain electrode 125 are formed on a substrate 110, and a semiconductor layer 130 is formed to contact the source electrode 121 and drain electrode 125, respectively. Referring to FIG. 5B, a donor film 10 for forming a gate insulating layer is prepared. The donor film 10 includes a base film 11, a light/heat conversion layer 12, and a transfer layer 13. The base film 11 is a support film, and includes a transparent polymer. For example, the base film 11 may be formed of a polyester such as polyethylene terephthalate, polyacryl, poly-epoxy, or polystyrene.

The light/heat conversion layer 12 includes an optical absorption material which absorbs infrared rays and visible rays. The transfer layer 13 is formed by depositing or coating a material for forming the gate insulating layer 140 on the light/heat conversion layer 12. The donor film 10 is not limited to the structure shown in FIG. 5B, and can have various structures. For example, an anti-reflection layer may be coated in order to prevent the degradation of the transfer layer 13 due to reflection of the light, or a gas generation layer may be further formed under the light/heat conversion layer 12 to improve the sensitivity of the donor film 10.

Figure 5C:
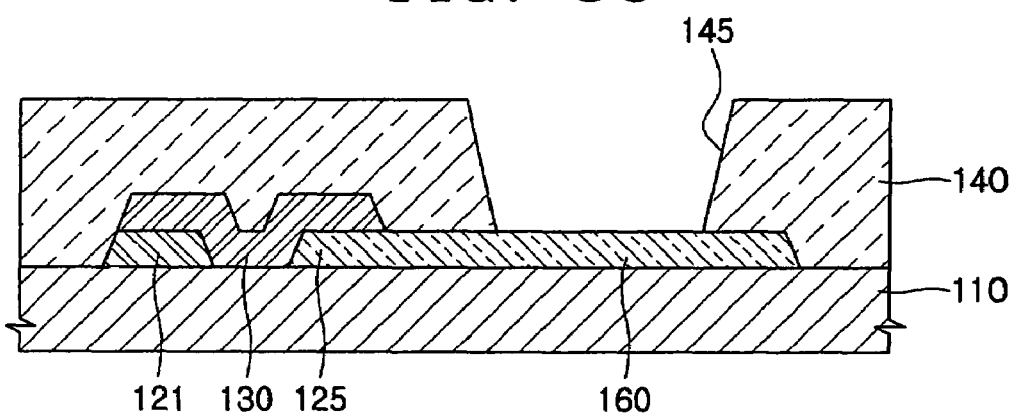
Figure 5D:
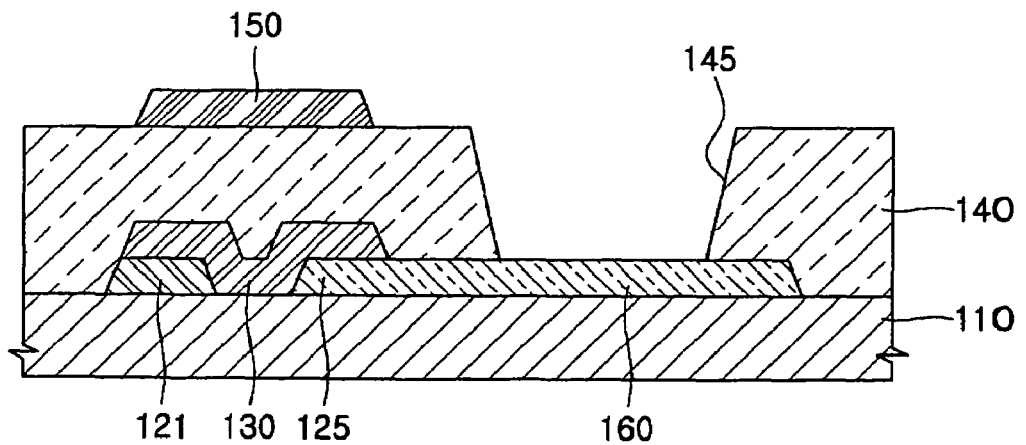

Referring to FIG. 5B and FIG. 5C, the donor film 10 is attached to the substrate 110, and a laser is radiated onto the entire donor film 10 except where an opening 145 is to be formed, thus attaching the transfer layer 13 to the substrate 110 and forming the gate insulating layer 140 having the opening 145 which exposes part of the lower electrode 160, that is, an anode electrode. The gate insulating layer 140 has the openings 145 shown in FIGS. 2A thru 2C. Referring to FIG. 5D, a gate 150 is formed on a portion of the gate insulating layer 140 corresponding to the semiconductor layer 130. In addition, an organic layer 170 and an upper electrode 180 are formed on the substrate 110, thereby completing the organic EL display apparatus 100.

Figure 6:
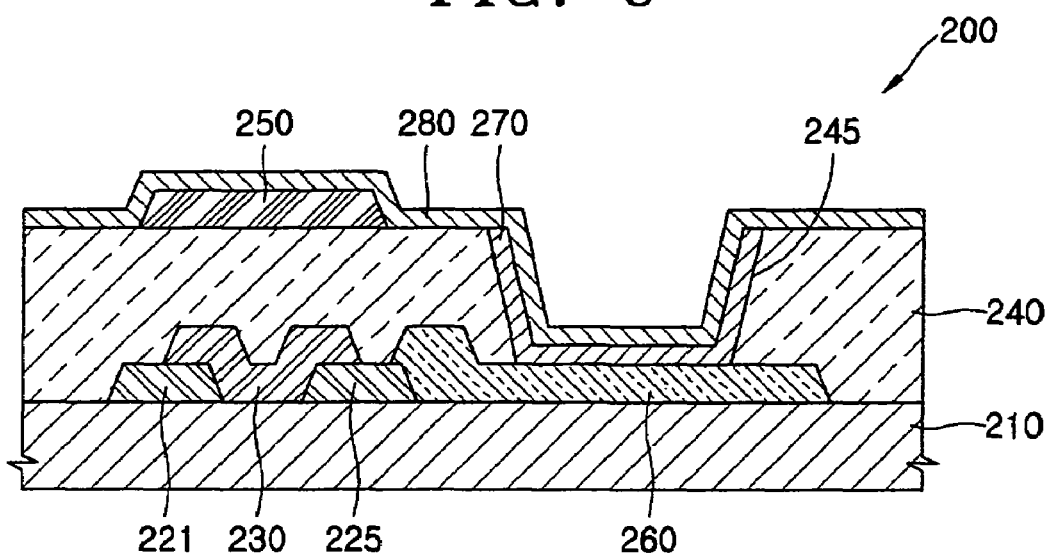
FIG. 6 is a cross-sectional view of an organic EL display apparatus according to another embodiment of the present invention.

FIG. 6 is a cross-sectional view of an organic EL display apparatus according to another embodiment of the present invention.

The organic EL display apparatus 200 includes a plurality of pixels arranged in a matrix on a substrate. Each of the pixels includes TFTs, for example, a switching TFT and a driving TFT, a capacitor, and an organic EL device. FIG. 6 illustrates the organic EL device and a driving TFT for driving the organic EL device.

Referring to FIG. 6, a source electrode 221 and a drain electrode 225 are formed on a substrate 210, and a lower electrode 260 is formed on the substrate 210 and is connected to one of the source electrode 221 and drain electrode 225, respectively, for example, the drain electrode 225. As in the previous embodiment, the substrate 210 may be a glass substrate, a plastic substrate, or a metal substrate. The lower electrode 260 acts as a pixel electrode. A semiconductor layer 230 is formed on the substrate 110 so as to contact the source electrode 221 and drain electrode 225, respectively. The semiconductor layer 230 may be an organic semiconductor layer or a silicon layer.

An insulating layer 240 is formed on the substrate 210, and a gate 250 is formed on the insulating layer 240. The insulating layer 240 acts as a pixel separation layer defining the lower electrode 260 with an opening 245 in a portion corresponding to the lower electrode 260, and acts as a gate insulating layer below the gate electrode 250. An organic layer 270 is formed on the lower electrode 260 in the opening 245, and an upper electrode 280 is formed over the entire substrate 210. The organic layer 270 may include one or more organic layers selected from a hole insertion layer, a hole transport layer, a light emitting layer, an electron transport layer, an electron insertion layer, and a hole restraint layer. In the present embodiment, the organic layer 270 is formed in the opening 245 of the insulating layer 140, but the present invention is not limited thereto. A light emitting layer (not shown) of each pixel may be formed in the opening 245 and separated from the light emitting layers of neighboring pixels, and the charge transport layer, that is, a common layer, may be formed over the entire substrate 210.

The insulating layer 240 includes the opening 245 for exposing the lower electrode 260. The openings 245 may form a mesh or lines as shown in FIGS. 2A thru 2C. The insulating layer 240 may be an inorganic insulating layer, an organic insulating layer, or an inorganic-organic hybrid layer, and may be formed as a single layer or a multi-layer. The inorganic insulating layer may be formed of a material selected from the group consisting of $SiO_2$, SiNx, $Al_2O_3$, $Ta_2O_5$, BST, and PZT. The organic insulating layer includes one or more organic insulating layers formed of materials selected from the group consisting of PS(polystyrene), phenol-based polymer, acryl-based polymer, an imide-based polymer such as polyimide, arylether-based polymer, amide-based polymer, fluoride-based polymer, p-xylen based polymer, vinyl alcohol-based polymer, and parylene.

In addition, the insulating layer 240 may be formed of a material which can be ablated by a laser. The insulating layer 240 may be formed of a material which can absorb laser energy, for example, $SiO_2$, $PI/Al_2O_3$ or an aromatic material, that is, a material including a functional group having benzene, for example, polyimide, poly vinyl phenol (PVP), or parylene. The insulating layer 240 may be formed of a material which does not absorb laser energy, for example, polyvinyl alcohol (PVA), polyvinyl chloride (PVC), poly methylmethacrylate (PMMA), or a fluoride-based polymer material. In this case, the material is mixed with 0.005 wt % or more of a chromophore having a band for absorbing the laser beam wavelength, or an insulating copolymer can be used.

The insulating layer 240 may be formed of a material which can be printed in an inkjet printing operation. The insulating layer may be formed of a material selected from the group consisting of $PI/Al_2O_3$, polyimide, poly vinyl phenol (PVP), polyvinyl alcohol (PVA), polyvinyl chloride (PVC), poly methylmethacrylate (PMMA).

Otherwise, the insulating layer 240 can be formed using an LITI method, and can be formed of a common polymer, for example, polyimide, PVP, PVA, PVC, PMMA, parylene, or polystyrene. Since the insulating layer 240 should cause a phase separation for the LITI process, two different kinds of common polymers can be mixed, or a low-molecular material such as zirconia or alumina can be mixed with the common polymer. The low-molecular material may be mixed with the common polymer in a ratio of 1:1-3:1. In addition, the semiconductor layer 230 and the source electrode 221 and drain electrode 225, respectively, should have a combined thickness of less than 5000 Å in order to perform the LITI process sufficiently. For example, the total thickness of the semiconductor layer 230 and the source electrode 221 and drain electrode 225, respectively, may be 2000-3000 Å.

To obtain a low contact resistance between the source electrode 221, the drain electrode 225, and the semiconductor layer 230, the source electrode 221 and the drain electrode 225 can be formed of a material having a work function dependent on the semiconductor layer 230. That is, the source electrode 221 and the drain electrode 225 can include an electrode material having a work function greater than that of the organic semiconductor layer 230 and a metal electrode material selected from Au, Pt, and Pd.

If the organic EL display apparatus 200 has a back emission structure, the lower electrode 260 may be a transparent electrode. The lower electrode 260 may be composed of a transparent conductive material such as ITO, IZO, ZnO, or $In_2O_3$. If the organic EL display apparatus has a front emission structure, the lower electrode 260 may be a reflective electrode, and thus, the lower electrode 260 may include a transparent conductive layer and a reflective layer having high reflectivity disposed under the transparent conductive layer. The transparent conductive layer may be formed of ITO, IZO, ZnO, or $In_2O_3$, and the reflective layer may be formed of Ag, Mg, Al, Pt, Pd, Au, Ni, Nd, Ir, Cr or a compound thereof.

If the organic EL display apparatus 200 is a back emission type device, the upper electrode 280 may be a reflective electrode formed of Li, Ca, LiF/Ca, LiF/Al, Al, Mg, or a compound thereof. If the organic EL display apparatus is a front emission type device, the upper electrode 280 may be a transparent electrode having a stacked structure in which a metal layer and a transparent conductive layer are stacked. The metal layer may be formed of Li, Ca, LiF/Ca, LiF/Al, Al, Mg, or a compound thereof, and the transparent conductive layer may be formed of ITO, IZO, ZnO, or $In_2O_3$.

FIGS. 7A thru 7D are cross-sectional views illustrating a method of fabricating the organic EL display apparatus shown in FIG. 6 using a laser ablation method according to an embodiment of the present invention.

Figure 7A:
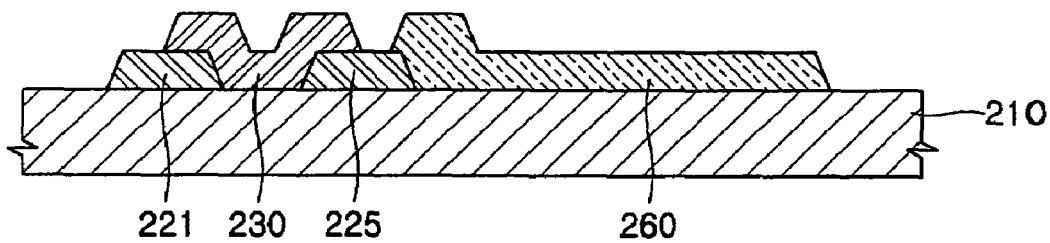
FIGS. 7A thru 7D are cross-sectional views illustrating a method of fabricating the organic EL display apparatus shown in FIG. 6 using a laser ablation method according to an embodiment of the present invention.

Referring to FIG. 7A, the source electrode 221 and the drain electrode 225 are formed on the substrate 210, and the lower electrode 260 is connected to one of the source electrode 221 and drain electrode 225, respectively, for example, to the drain electrode 225. In addition, the semiconductor layer 230 is formed so as to contact the source electrode 221 and drain electrode 225, respectively. In the present embodiment, the semiconductor layer 230 is formed after forming the lower electrode 260. However, the lower electrode 260 can be formed after forming the semiconductor layer 230 if characteristics of the organic EL device 200 are not affected.

Figure 7B:
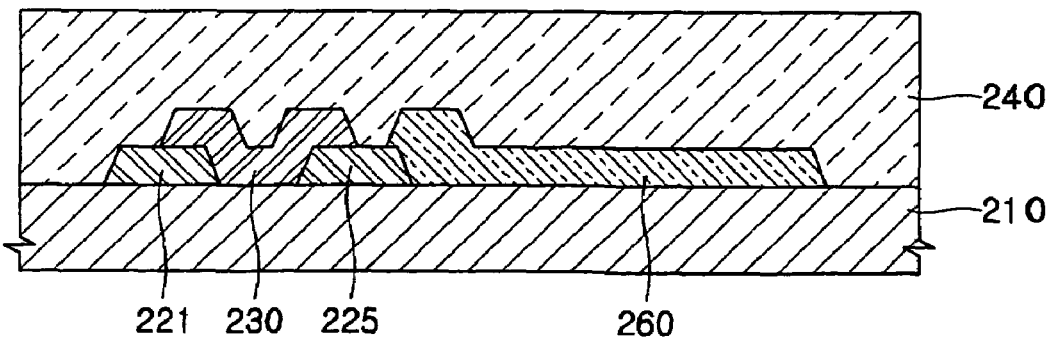

Referring to FIG. 7B, the gate insulating layer 240 is formed on the substrate 210. The gate insulating layer 240 may be an inorganic insulating layer, an organic insulating layer, or an inorganic-organic hybrid layer which can absorb laser energy, and which is formed as a single layer or a multi-layer. The gate insulating layer 240 may be formed of a material such as $SiO_2$, polyimide, PVP (poly vinyl phenol), parylene, or $PI/Al_2O_3$. If the material is, for example, polyvinyl alcohol (PVA), polyvinyl chloride (PVC), poly methylmethacrylate (PMMA), or fluoride-based polymer material, and thus does not absorb laser energy, 0.005 wt % or more of chromophore having a band for absorbing a laser beam wavelength can be mixed in the material, or an insulating material of copolymer can be used.

Figure 7C:
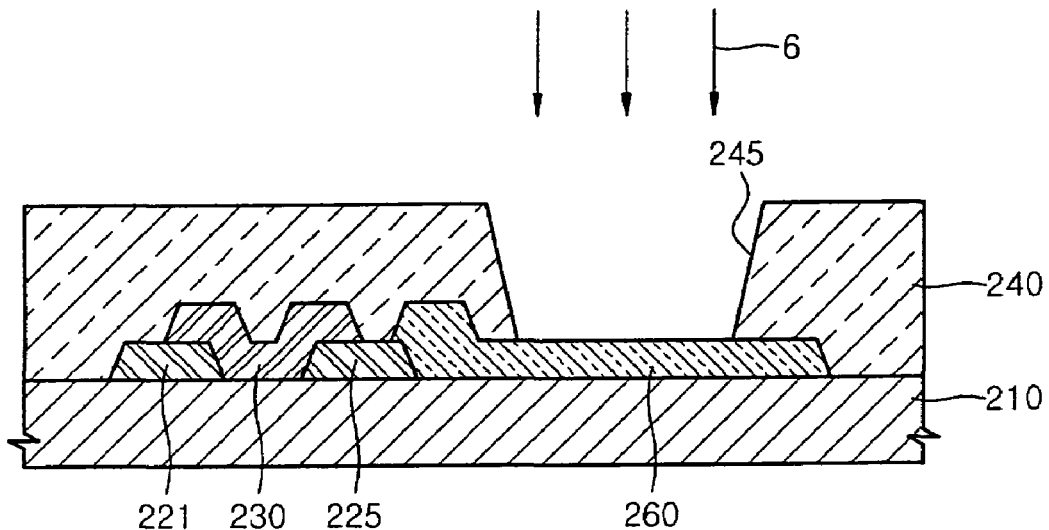

Referring to FIG. 7C, a laser beam 6 is radiated onto a portion of the gate insulating layer 240 which corresponds to the lower electrode 260 using the laser ablation method. The gate insulating layer 240 is thus etched to form the opening 245. The gate insulating layer 240 has opening 245 corresponding to the openings 145 shown in FIGS. 2A thru 2C.

The laser 6 is preferably an excimer laser. The excimer laser generates light having a wavelength of 248 nm or 308 nm. When the gate insulating layer 240 absorbs the light with a wavelength of 248 nm or 308 nm, the laser ablation process is performed. In this regard, the gate insulating layer 240 may absorb at least 0.005% of the laser beam wavelength. In the present embodiment, the laser 6 is preferably an excimer laser, but the invention is not limited thereto. In addition, the opening 245 of the insulating layer 240 can be formed using a photolithography process instead of the laser ablation method.

Figure 7D:
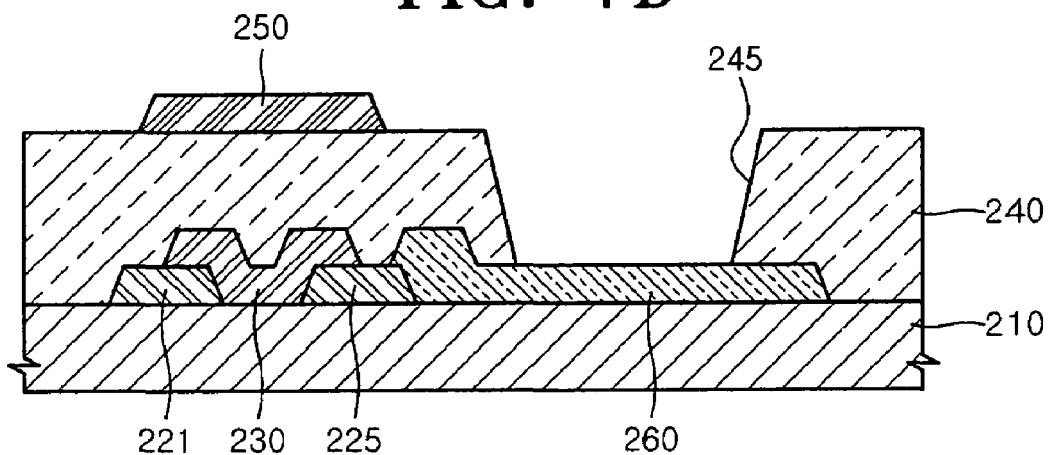

Referring to FIG. 7D, the gate 250 is formed on a portion of the insulating layer 240 corresponding to the semiconductor layer 230. In addition, the organic layer 270 and the upper electrode 280 (see FIG. 6) are formed on the substrate 210, and thus the organic EL display apparatus 200 can be fabricated.

FIGS. 8A thru 8D are cross-sectional views illustrating a method of fabricating the organic EL display apparatus shown in FIG. 6 using an inkjet method according to an embodiment of the present invention.

Figure 8A:
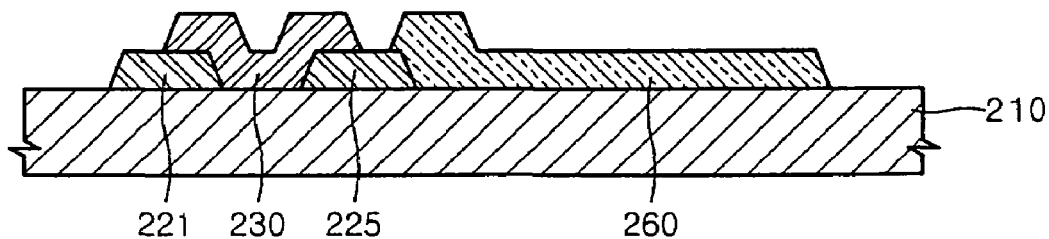
FIGS. 8A thru 8D are cross-sectional views illustrating a method of fabricating the organic EL display apparatus shown in FIG. 6 using an ink-jet method according to an embodiment of the present invention.
Figure 8B:
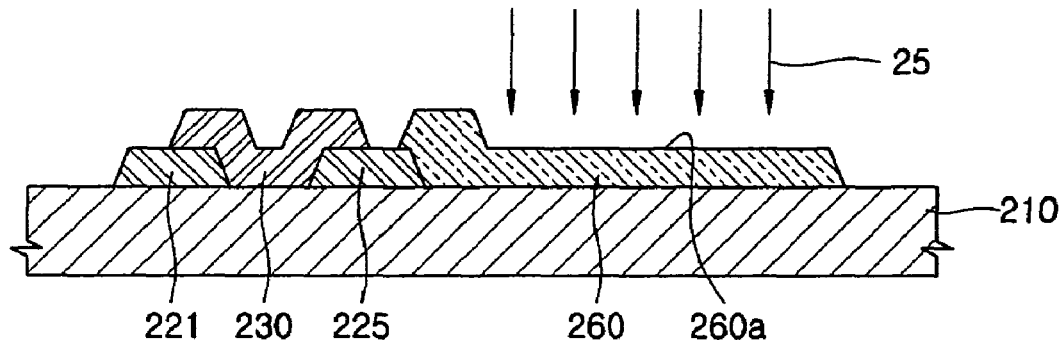

Referring to FIG. 8A, a source electrode 221 and a drain electrode 225 are formed on a substrate 210, and a lower electrode 260 is formed so as to be connected to the source electrode 221 or the drain electrode 225, for example, the drain electrode 225. In addition, the semiconductor layer 230 is formed so as to contact the source electrode 221 and drain electrode 225 preferably. Referring to FIG. 8B, a surface 260a of the lower electrode 260 is partially treated. The surface treatment is performed using a fluoride-based plasma 25 so as to make the surface 260a hydrophobic. The surface treatment using the fluoride-based plasma 25 can be performed using a fluoride-based gas such as $CF_4$ or $C_3F_8$.

Figure 8C:
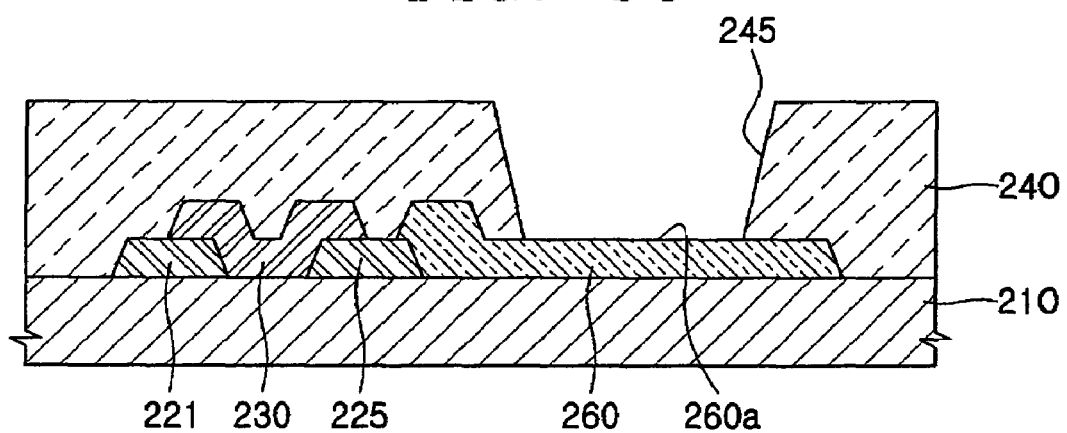

Referring to FIG. 8C, a solution including an insulating material for forming a gate insulating layer is discharged from an inkjet head (not shown) onto the substrate 210, and thus the gate insulating layer 240 is formed. The gate insulating layer 240 is not formed on the surface-treated portion 260a of the lower electrode 260, and thus an opening 245 exposing the lower electrode 260 is formed. The gate insulating layer 240 includes the opening 245 which corresponds to the openings 145 shown in FIGS. 2A thru 2C. The gate insulating layer 240 is composed of a material selected from the group consisting of $PI/Al_2O_3$, polyimide, poly vinyl phenol (PVP), polyvinyl alcohol (PVA), polyvinyl chloride (PVC), poly methylmethacrylate (PMMA).

If the surface of the substrate 210 and the ink are not adhered firmly, that is, if the surface of the substrate 210 is hydrophobic, the surface of the substrate 210 excluding the portion corresponding to the opening 245 exposing the lower electrode 260 can be treated to form the gate insulating layer 240 including the opening 245. That is, the entire surface excluding the surface 260a of the lower electrode 260, which corresponds to the opening 245, can be treated using Ar and O₂ plasma so that the surface of the substrate is hydrophilic. The ink including the gate insulating material is discharged onto the substrate 210, and thus the gate insulating layer 240 can be coated on the surface treated portion. Therefore, the gate insulating layer 240 is not formed on the surface 260a of the lower electrode 260, which is not treated with the plasma.

Figure 8D:
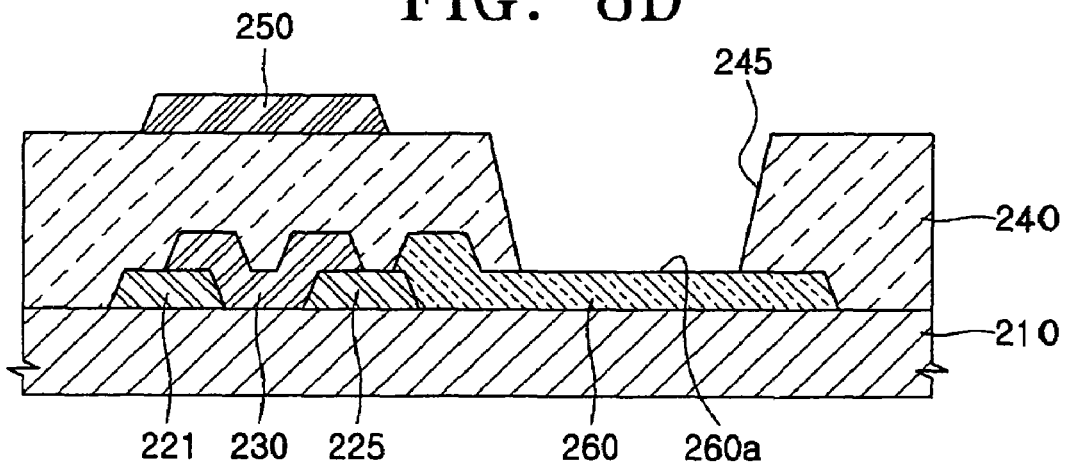

Referring to FIG. 8D, the gate 250 is formed on a portion of the gate insulating layer 240 above the semiconductor layer 230. In addition, the organic layer 270 and the upper electrode 280 (see FIG. 6) are formed on the substrate 210, thus completing fabrication of the organic EL display apparatus 200.

FIGS. 9A thru 9D are cross-sectional views illustrating a method of fabricating the organic EL display apparatus shown in FIG. 6 using a laser transfer method according to an embodiment of the present invention.

Figure 9A:
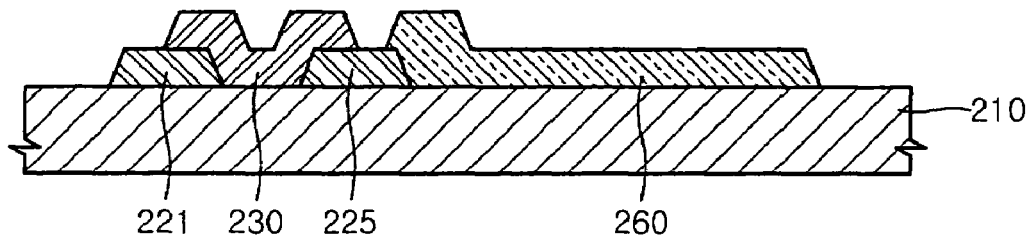
FIGS. 9A thru 9D are cross-sectional views illustrating a method of fabricating the organic EL display apparatus shown in FIG. 6 using a laser induced thermal image method according to an embodiment of the present invention.
Figure 9B:
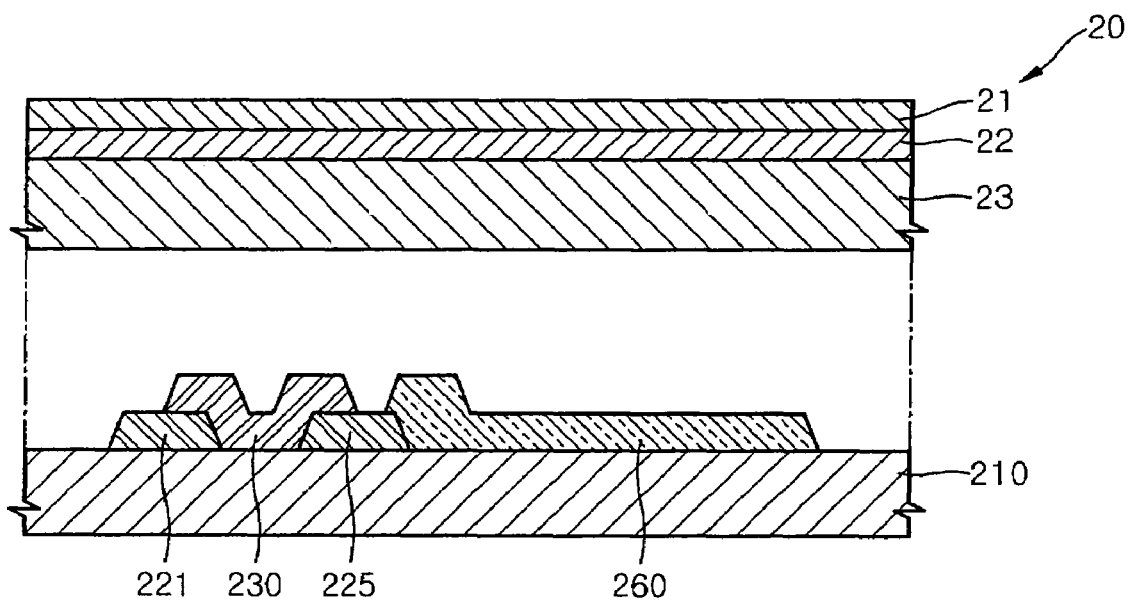

Referring to FIG. 9A, a source electrode 221 and a drain electrode 225 are formed on a substrate 210, a lower electrode 260 is connected to one of the source electrode 221 and drain electrode 225, respectively, for example, the drain electrode 225, and a semiconductor layer 230 is formed so as to contact the source electrode 221 and drain electrode 225, respectively. Referring to FIG. 9B, a donor film 20 for forming a gate insulating layer is prepared. The donor film 20 has the same structure as that of the donor film 10 described above. That is, the donor film 20 includes a base film 21, a light/heat conversion layer 22, and a transfer layer 23. The transfer layer 23 includes a layer for forming the gate insulating layer 240.

Figure 9C:
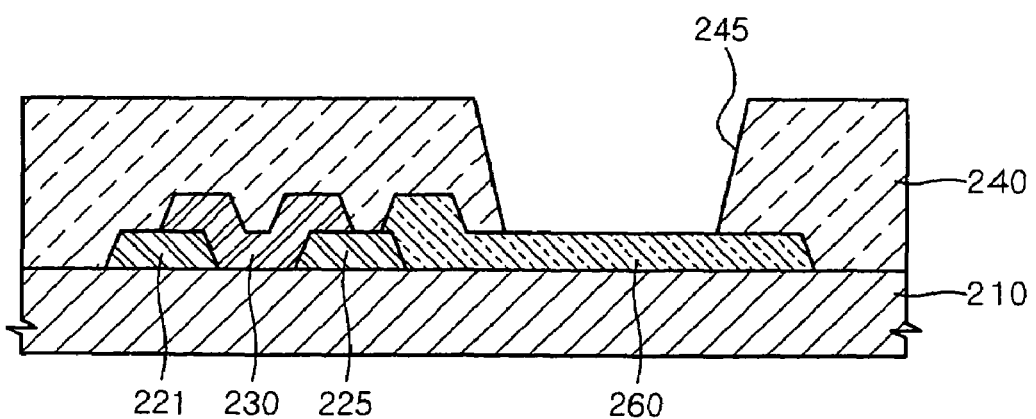
Figure 9D:
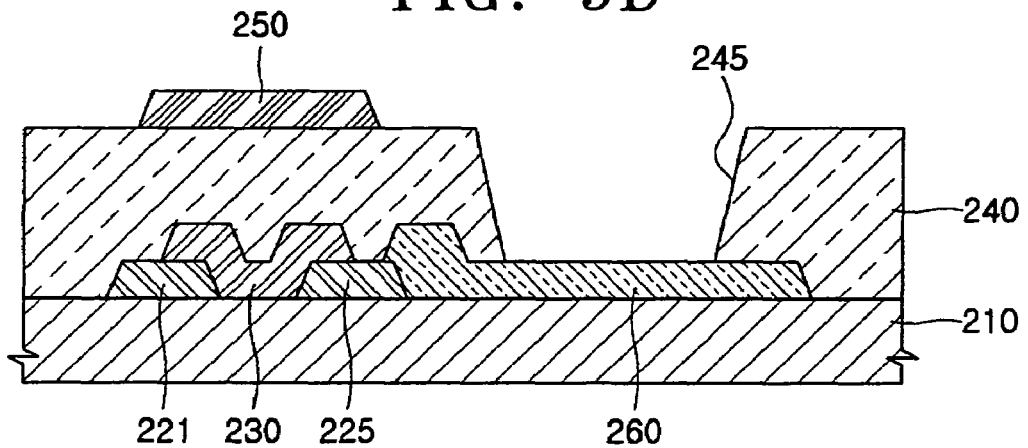

Referring to FIG. 9B and FIG. 9C, the donor film 20 is attached to the substrate 210, and a laser is radiated onto the entire donor film 20 except where an opening 245 is to be formed, thus attaching the transfer layer 23 to the substrate 210 and forming the gate insulating layer 240 having the opening 245 which exposes part of the lower electrode 260, that is, an anode electrode. The gate insulating layer 240 has an opening 245 corresponding to the openings 145 shown in FIGS. 2A thru 2C. Referring to FIG. 9D, a gate 250 is formed on a portion of the gate insulating layer 240 corresponding to the semiconductor layer 230. In addition, an organic layer 270 and an upper electrode 280 (see FIG. 6) are formed on the substrate 210, thereby completing the organic EL display apparatus 200.

Figure 10:
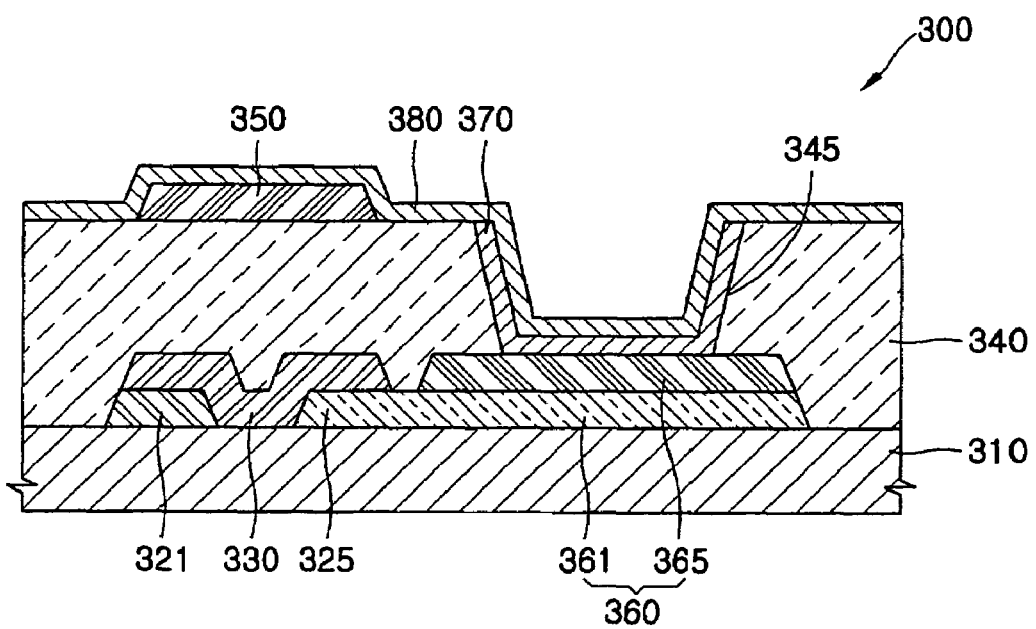
FIG. 10 is a cross-sectional view of an organic EL display apparatus according to another embodiment of the present invention.

FIG. 10 is a cross-sectional view of an organic EL display apparatus according to another embodiment of the present invention.

The organic EL display apparatus 300 includes a plurality of pixels arranged in a matrix on a substrate. Each of the pixels includes TFTs, for example, a switching TFT and a driving TFT, a capacitor, and an organic EL device. FIG. 10 illustrates the organic EL device and a driving TFT for driving the organic EL device.

Referring to FIG. 10, a source electrode 321 and a drain electrode 325 are formed on a substrate 310, and a lower electrode 360 is formed on the substrate 310 so as to be connected to one of the source electrode 321 and drain electrode 325, respectively, for example, the drain electrode 325. As in the previous embodiment, the substrate 310 may be a glass substrate, a plastic substrate, or a metal substrate. In addition, a semiconductor layer 330 which contacts the source electrode 321 and drain electrode 325, respectively, may be an organic semiconductor layer or a silicon layer. The lower electrode 260 acts as a pixel electrode.

An insulating layer 340 is formed on the substrate 310, and a gate 350 is formed on the insulating layer 340. The insulating layer 340 has openings 345 forming a mesh or lines in portions corresponding to the lower electrode 360. The insulating layer 340 acts as a pixel separation layer defining the lower electrode 360, and acts as a gate insulating layer. An organic layer 370 is formed on the lower electrode 360 in the opening 345, and an upper electrode 380 is formed over the entire substrate 310. The organic layer 370 may include one or more organic layers selected from a hole insertion layer, a hole transport layer, a light emitting layer, an electron transport layer, an electron insertion layer, and a hole restraint layer. In the present embodiment, the organic layer 370 is formed in the opening 345 of the insulating layer 340, but the present invention is not limited thereto. A light emitting layer (not shown) of each pixel may be formed in the opening 345 and separated from light emitting layers of the neighboring pixels, and the charge transport layer, that is, a common layer, may be formed over the entire substrate 310.

The insulating layer 340 may be an inorganic insulating layer, an organic insulating layer, or an inorganic-organic hybrid layer, and may be formed as a single layer or a multilayer. The inorganic insulating layer may be formed of a material selected from the group consisting of $SiO_2$, SiNx, $Al_2O_3$, $Ta_2O_5$, BST, and PZT. The organic insulating layer is formed of one or more organic insulating materials selected from the group consisting of polystyrene (PS), phenol-based polymer, acryl-based polymer, an imide-based polymer such as polyimide, arylether-based polymer, amide-based polymer, fluoride-based polymer, p-xylene based polymer, vinyl alcohol-based polymer, and parylene.

In addition, the insulating layer 340 may be formed of a material which can be ablated by a laser. The insulating layer 340 may be formed of a material which can absorb laser energy, for example, $SiO_2$, $PI/Al_2O_3$ or an aromatic material, that is, a material including a functional group having benzene, for example, polyimide, poly vinyl phenol (PVP), or parylene. The insulating layer 340 may be formed of a material which does not absorb laser energy, for example, polyvinyl alcohol (PVA), polyvinyl chloride (PVC), poly methylmethacrylate (PMMA), or a fluoride-based polymer material. In this case, the material is mixed with 0.005 wt % or more of a chromophore having a band for absorbing the laser beam wavelength, or an insulating copolymer can be used.

The insulating layer 340 may be formed of a material which can be printed in an inkjet printing operation. The insulating layer 340 may be formed of a material selected from the group consisting of $PI/Al_2O_3$, polyimide, PVP, PVA, PVC and PMMA.

Otherwise, the insulating layer 340 can be formed using an LITI method, and can be formed of a common polymer, for example, polyimide, poly vinyl phenol (PVP), polyvinyl alcohol (PVA), polyvinyl chloride (PVC), poly methylmethacrylate (PMMA), parylene, or polystyrene. Since the insulating layer 340 should cause a phase separation for the laser transfer operation, two different kinds of common polymers can be mixed, or a low-molecular material such as zirconia or alumina can be mixed with the common polymer. The low-molecular material may be mixed with the common polymer in a ratio of 1:1-3:1. In addition, the semiconductor layer 330 and the source electrode 321 and drain electrode 325, respectively, should have a combined thickness of less than 5000 Å in order to perform the LITI method sufficiently. For example, the total thickness of the semiconductor layer 330 and the source electrode 321 and drain electrode 325, respectively, may be 2000-3000 Å.

In the organic EL display apparatus 300, the source electrode 321 and the drain electrode 325 are formed of different materials. To obtain a low contact resistance between the source electrode 321 and the semiconductor layer 330, the source electrode 321 can be formed of a material having a work function dependent on the semiconductor layer 330. That is, the source electrode 321 can include an electrode material having a work function greater than that of the organic semiconductor layer 330 and a conductive material selected from Au, Pt, Pd, oxide MoW, and PEDOT. The drain electrode 325 acts as a reflective layer 361 of the lower electrode 360, and thus, is formed of a material having high reflectivity, for example, Ag, Mg, Al, Pt, Pd, Au, Ni, Nd, Ir, Cr or a compound thereof.

The lower electrode 360 acts as a pixel electrode in each of the pixels, and includes a reflective layer 361 and a transparent electrode 365. The reflective layer 361 extends from the drain electrode 325, and is formed of a material having high reflectivity, for example, Ag, Mg, Al, Pt, Pd, Au, Ni, Nd, Ir, Cr or a compound thereof. The transparent electrode 365 includes a transparent conductive layer composed of a material such as ITO, IZO, ZnO, or $In_2O_3$.

The organic EL display apparatus 300 is a front emission type device, and thus the upper electrode 380 includes the transparent electrode. The upper electrode 380 has a stacked structure, in which a metal layer and the transparent conductive layer are stacked. The metal layer in the upper electrode 380 is formed of Li, Ca, LiF/Ca, LiF/Al, Al, Mg, or a compound thereof, and the transparent conductive layer is formed of ITO, IZO, ZnO, or $In_2O_3$.

FIGS. 11A thru 11D are cross-sectional views illustrating a method of fabricating the organic EL display apparatus shown in FIG. 10 using a laser ablation method according to an embodiment of the present invention.

Figure 11A:
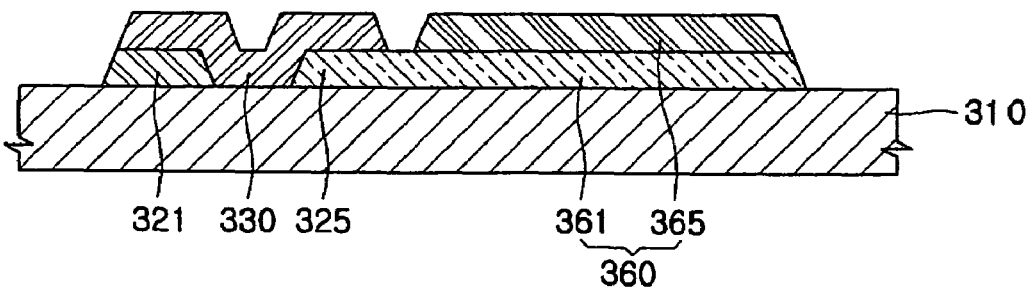
FIGS. 11A thru 11D are cross-sectional views illustrating a method of fabricating the organic EL display apparatus shown in FIG. 10 using a laser ablation method according to an embodiment of the present invention.

Referring to FIG. 11A, the source electrode 321 and the drain electrode 325 are formed on the substrate 310. In addition, the lower electrode 360 is formed by disposing the transparent electrode 365 so as to overlap one of the source electrode 321 and drain electrode 325, respectively, for example, the drain electrode 325. The lower electrode 360 has a stacked structure in which the reflective layer 361 extending from the drain electrode 325 and the transparent electrode 365 are stacked. In addition, the semiconductor layer 330 is formed so as to contact the source electrode 321 and drain electrode 325, respectively. The drain electrode 325 can be formed after forming the source electrode 321, or the source electrode 321 can be formed after forming the drain electrode 325. Also, in the present embodiment, the semiconductor layer 330 is formed after forming the transparent electrode 365, but the transparent electrode 365 can be formed after forming the semiconductor layer 330 if characteristics of the organic EL device are not affected.

Figure 11B:
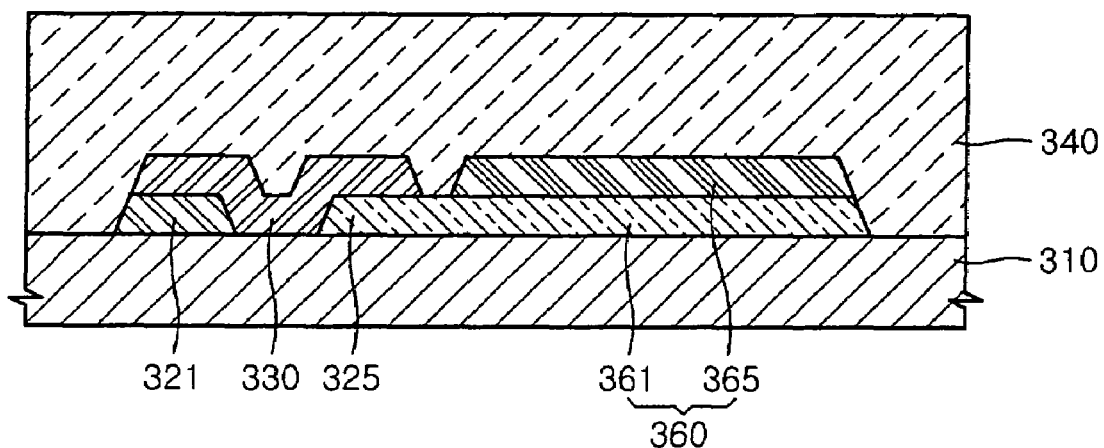

Referring to FIG. 11B, the gate insulating layer 340 is formed on the substrate 310. The gate insulating layer 340 may be an inorganic insulating layer, an organic insulating layer, or an inorganic-organic hybrid layer which can absorb laser energy, and is formed as a single layer or a multi-layer. The gate insulating layer 340 may be formed of a material such as $SiO_2$, polyimide, poly vinyl phenol (PVP), parylene, or $PI/Al_2O_3$. If the material is, for example, polyvinyl alcohol (PVA), polyvinyl chloride (PVC), poly methylmethacrylate (PMMA), or fluoride-based polymer material, and thus does not absorb laser energy, 0.005 wt % or more of chromophore having a band for absorbing a laser beam wavelength can be mixed in the material, or an insulating material of copolymer can be used.

Figure 11C:
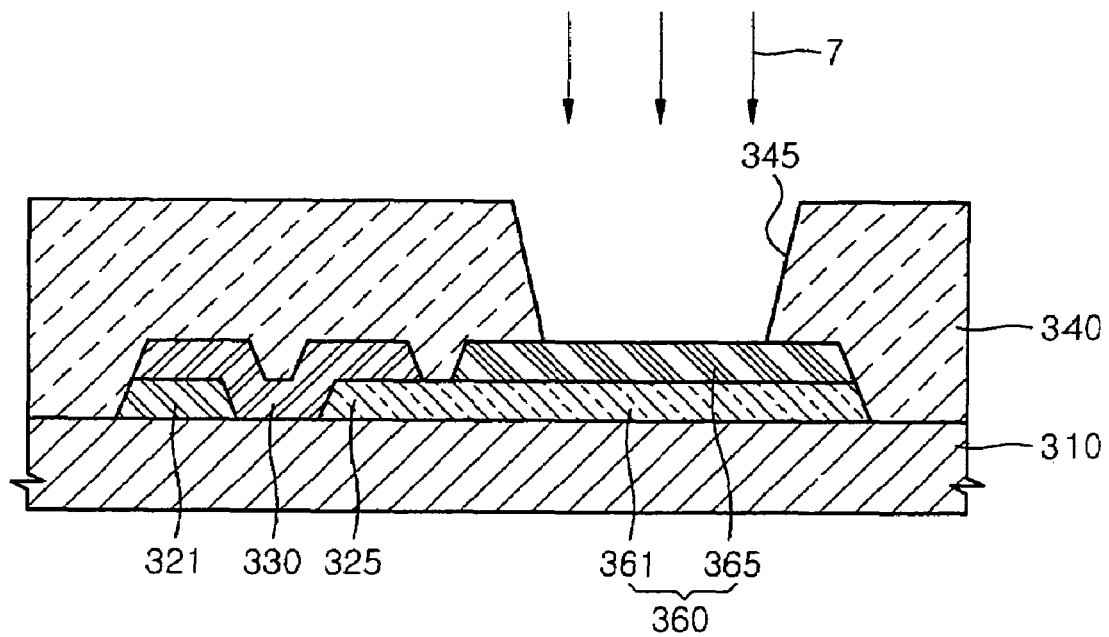

Referring to FIG. 11C, a laser beam 7 is radiated onto a portion of the gate insulating layer 340 which corresponds to the drain electrode 325 using the laser ablation method. The gate insulating layer 340 is thus etched to form the openings 345. The gate insulating layer 340 has the opening 345 corresponding to the openings 145 shown in FIGS. 2A thru 2C.

The laser beam 7 is preferably produced by an excimer laser. The excimer laser generates light having a wavelength of 248 nm or 308 nm. When the gate insulating layer 340 absorbs the light with a wavelength of 248 nm or 308 nm, the laser ablation process is performed. In this regard, the gate insulating layer 340 may absorb at least 0.005% of the laser beam wavelength. In the present embodiment, the laser beam 7 is generated by an excimer laser, but the invention is not limited thereto. In addition, the opening 345 of the insulating layer 340 can be formed using a photolithography process instead of the laser ablation method.

Figure 11D:
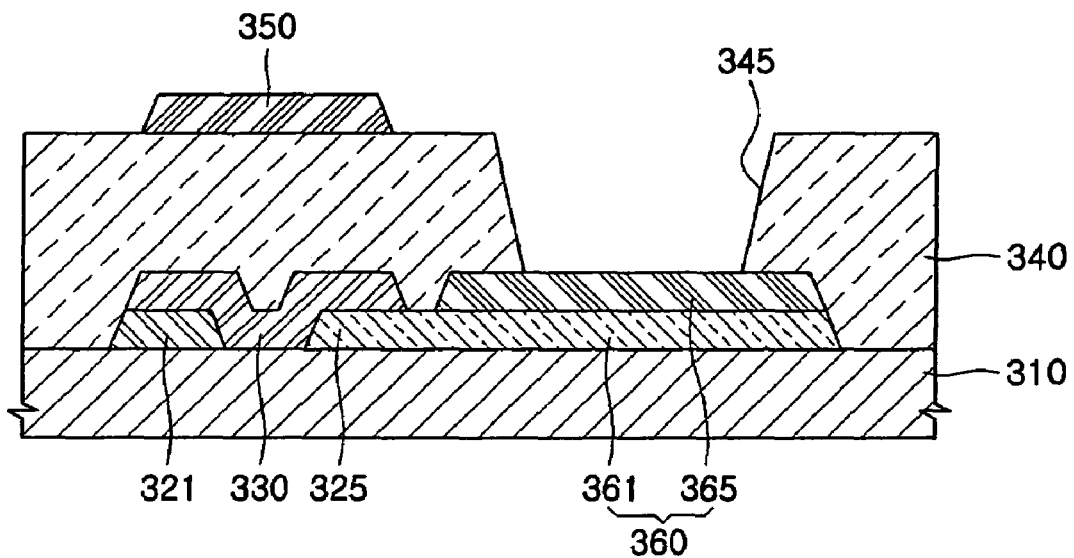

Referring to FIG. 11D, the gate 350 is formed on a portion of the insulating layer 340 corresponding to the semiconductor layer 330. In addition, the organic layer 370 and the upper electrode 380 (see FIG. 10) are formed on the substrate 310, and thus the organic EL display 100 is fabricated.

FIGS. 12A thru 12D are cross-sectional views illustrating a method of fabricating the organic EL display apparatus shown in FIG. 10 using an inkjet method according to an embodiment of the present invention.

Figure 12A:
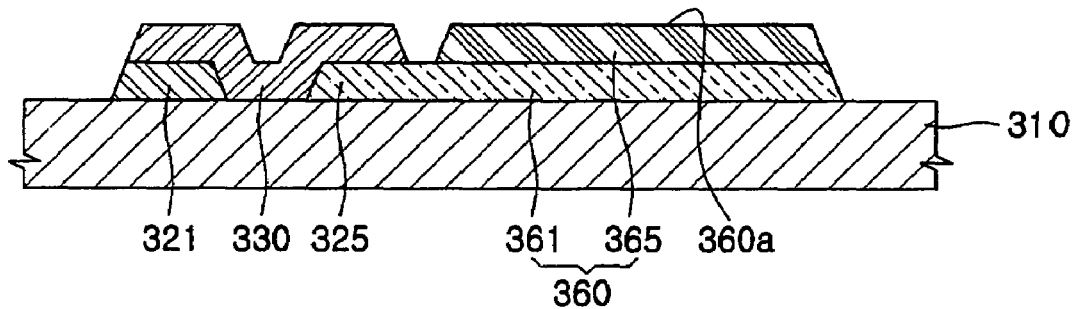
FIGS. 12A thru 12D are cross-sectional views illustrating a method of fabricating the organic EL display apparatus shown in FIG. 10 using an inkjet method according to an embodiment of the present invention.
Figure 12B:
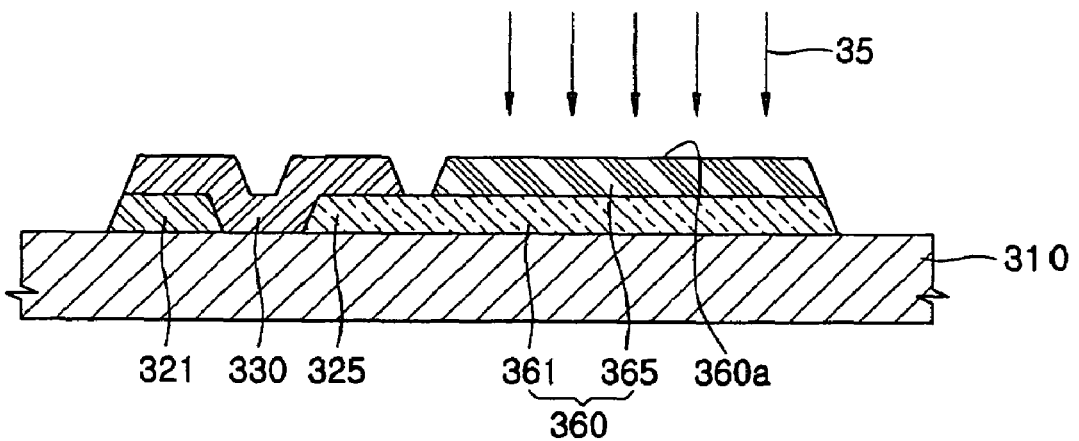

Referring to FIG. 12A, the source electrode 321 and the drain electrode 325 are formed on the substrate 310, and the transparent electrode 365 is formed so as to overlap one of the source electrode 321 and drain electrode 325, respectively, for example, the drain electrode 325. In addition, the semiconductor layer 330 is formed so as to contact the source electrode 321 and drain electrode 325, respectively. Referring to FIG. 12B, a surface 360a of a part of the lower electrode 360 is partially treated. The surface treatment is performed using fluoride-based plasma 35 to make the surface 360a hydrophobic so that an adhesive force between the surface 360a and ink is reduced in a following inkjet process. The surface treatment using the fluoride-based plasma 35 can be performed using a fluoride-based gas such as $CF_4$ or $C_3F_8$.

Figure 12C:
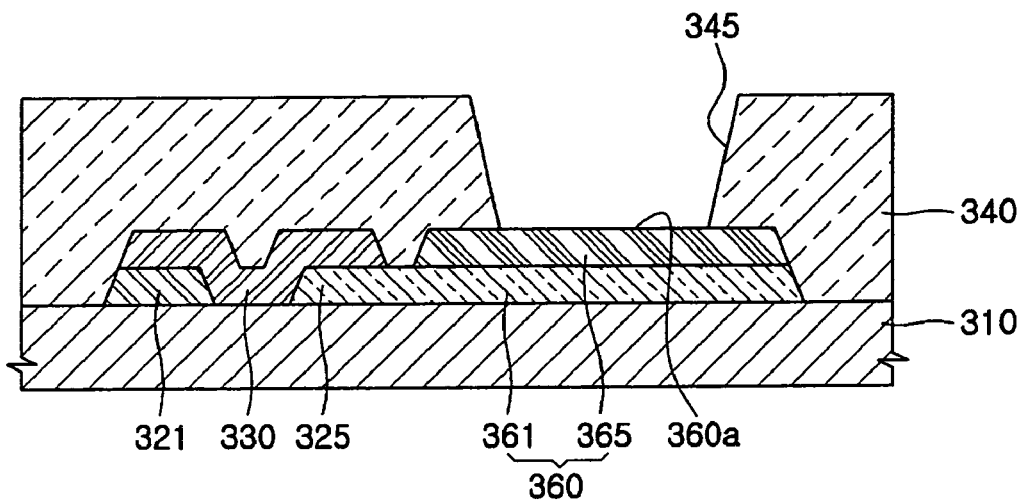

Referring to FIG. 12C, a solution including an insulating material for forming the gate insulating layer 340 is discharged from an inkjet head (not shown) onto the substrate 310, thus forming the gate insulating layer 340. The gate insulating layer 340 is not formed on the surface-treated portion 360a of the lower electrode 360, and thus the opening 345 exposing the lower electrode 360 is formed. The gate insulating layer 340 includes the opening 345 which corresponds to the openings 145 shown in FIGS. 2A thru 2C. The gate insulating layer 340 includes a layer formed of a material selected from the group consisting of $PI/Al_2O_3$, polyimide, poly vinyl phenol (PVP), parylene, polyvinyl alcohol (PVA), polyvinyl chloride (PVC), poly methylmethacrylate (PMMA).

If the surface of the substrate 310 and the ink are not adhered firmly, that is, if the surface of the substrate 310 is hydrophobic, the surface of the substrate 310 excluding the portion corresponding to the opening 345 exposing the lower electrode 360 can be treated to form the gate insulating layer 340 having the opening 345. That is, the entire surface excluding the surface 360a of the lower electrode 360, which corresponds to the opening 345, can be treated using Ar and $O_2$ plasma so that the surface of the substrate is hydrophilic. The ink including the gate insulating material is discharged onto the substrate 310, and thus the gate insulating layer 340 can be coated on the surface treated portion. Therefore, the gate insulating layer 340 is not formed on the surface 360a of the lower electrode 360, which is not treated using the plasma.

Figure 12D:
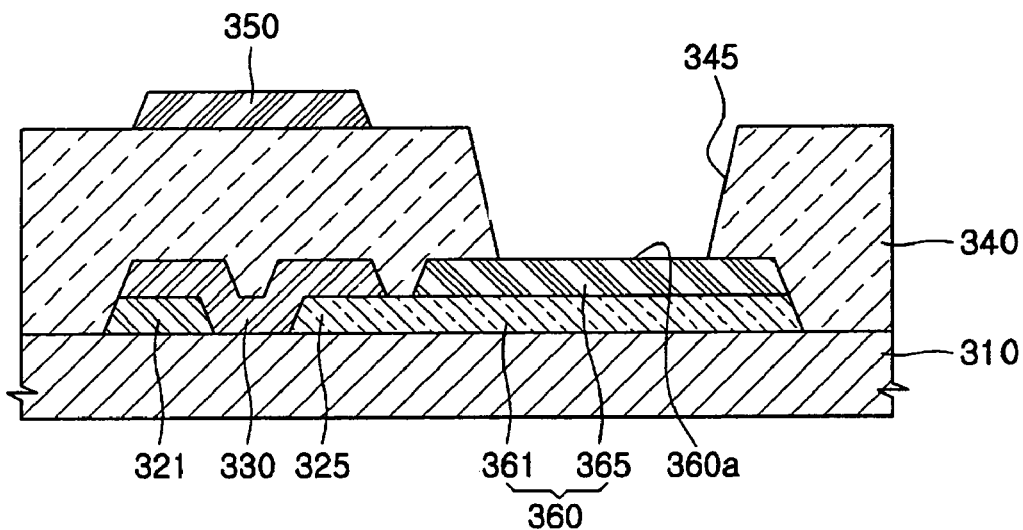

Referring to FIG. 12D, the gate 350 is formed on a portion of the gate insulating layer 340 above the semiconductor layer 330. In addition, the organic layer 370 and the upper electrode 380 (see FIG. 10) are formed on the substrate 310, thus completing fabrication of the organic EL display apparatus 300.

FIGS. 13A thru 13D are cross-sectional views illustrating a method of fabricating the organic EL display apparatus shown in FIG. 10 using a laser transfer method according to an embodiment of the present invention.

Figure 13A:
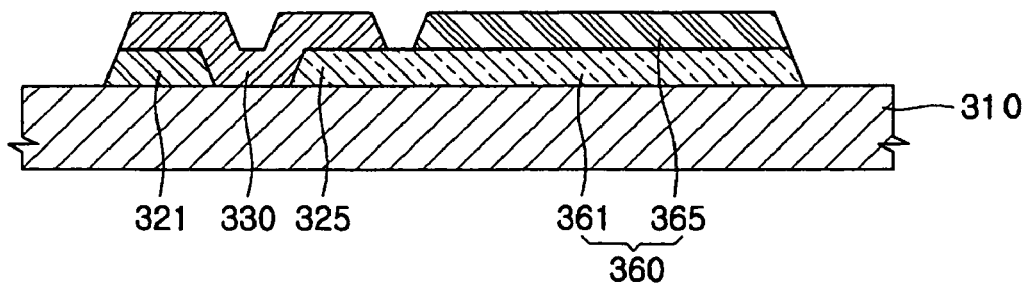
FIGS. 13A thru 13D are cross-sectional views illustrating a method of fabricating the organic EL display apparatus shown in FIG. 10 using a laser induced thermal image method according to an embodiment of the present invention.
Figure 13B:
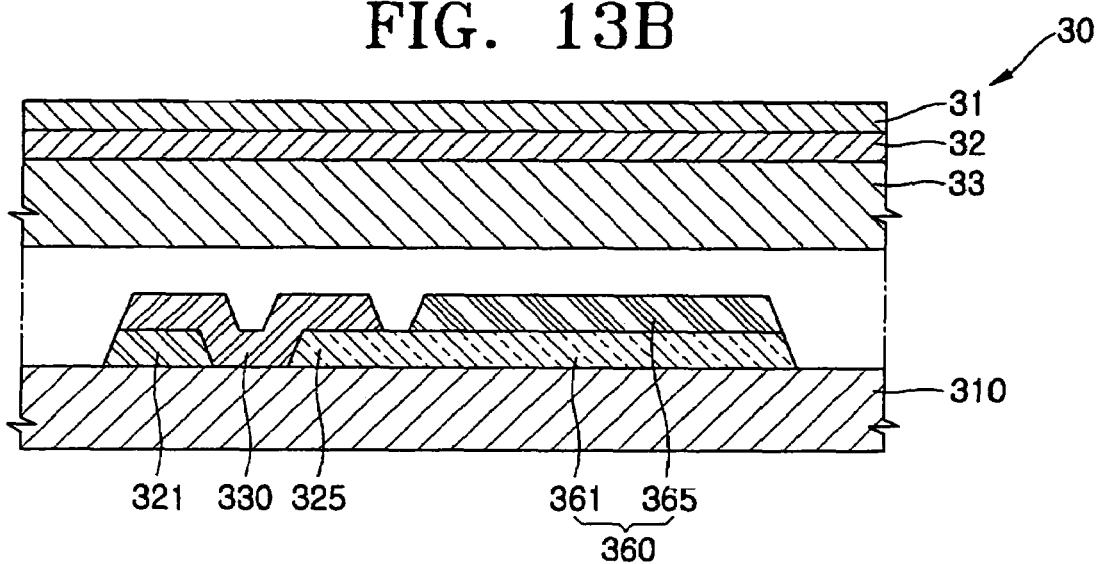

Referring to FIG. 13A, the source electrode 321 and the drain electrode 325 are formed on the substrate 310, the transparent layer 365 is formed to overlap one of the source electrode 321 and drain electrode 325, respectively, for example, the drain electrode 325, and the semiconductor layer 330 is formed to contact the source electrode 321 and drain electrode 325, respectively. Referring to FIG. 12B, a donor film 30 for forming a gate insulating layer is prepared. The donor film 30 has a structure the same as that of the donor film 10 according to the previous embodiment. That is, the donor film 30 includes a base film 31, a light/heat conversion layer 32, and a transfer layer 33. The transfer layer 33 includes a layer for forming the gate insulating layer.

Figure 13C:
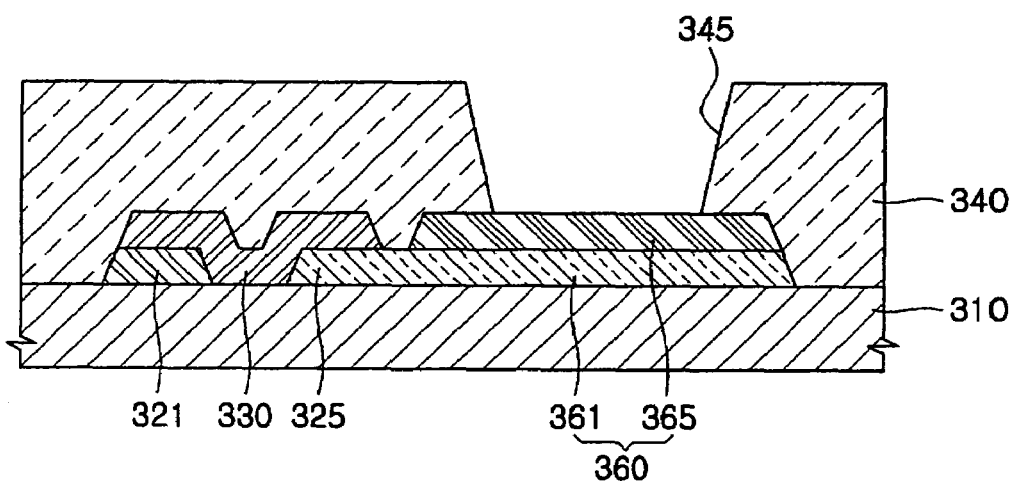
Figure 13D:
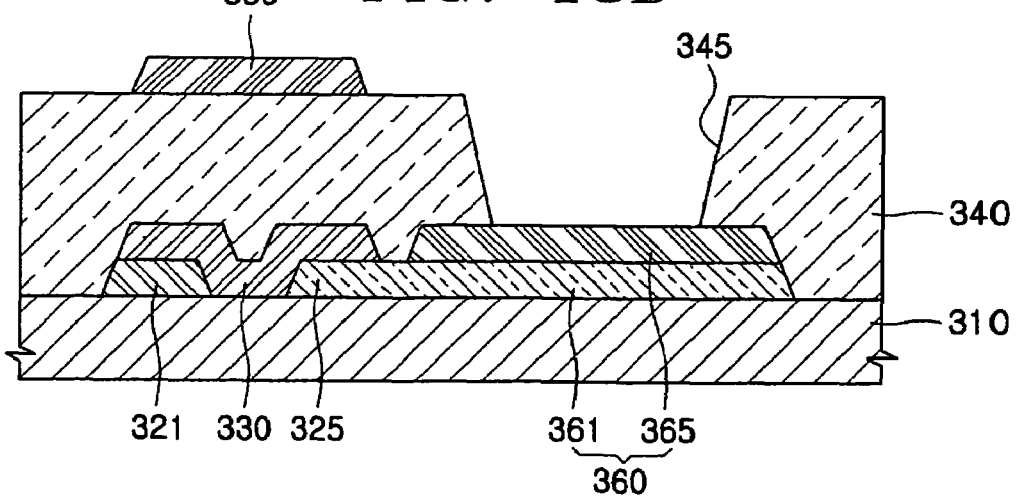

Referring to FIG. 3B and FIG. 13C, the donor film 30 is attached to the substrate 310, and a laser is radiated onto the entire donor film 30 except where an opening 345 is to be formed, thus attaching the transfer layer 33 to the substrate 310 and forming the gate insulating layer 340 having the opening 345 which exposes part of the lower electrode 360, that is, an anode electrode. The gate insulating layer 340 has an opening 345 corresponding to the openings 145 shown in FIGS. 2A thru 2C. Referring to FIG. 13D, a gate 350 is formed on a portion of the gate insulating layer 340 corresponding to the semiconductor layer 330. In addition, an organic layer 370 and an upper electrode 380 (see FIG. 10) are formed on the substrate 310, thereby completing the organic EL display apparatus 300.

In the embodiments of the present invention, since the gate insulating layer acts as a pixel separation layer, the upper electrode directly contacts the gate electrode. However, the gate electrode and the upper electrode can be electrically separated from each other by forming an insulating layer threrebetween, although not shown in the drawings.

In the embodiments of the present invention described herein, the gate insulating layer is used as the pixel separation layer defining the pixel electrode in the organic EL display apparatus including the organic TFT, but the gate insulating layer can be applied to a flat panel display apparatus such as a liquid crystal display apparatus using a TFT as a switching device.

In addition, according to the embodiments of the present invention described herein, the organic EL display apparatus includes a top-gate type TFT, but the present invention is not limited thereto. The present invention can also be applied to a structure in which the gate insulating layer is used as the pixel separation layer.

In addition, the driving TFT and the organic EL device are in the pixel region in the embodiments of the present invention disclosed herein, but the organic EL apparatus can have various pixel structures.

According to the organic EL display apparatus and the method of fabricating the organic EL display apparatus of the present invention, since the gate insulating layer acts as the pixel separation layer defining the pixel electrode, a masking process for forming a via hole connecting the pixel electrode to the source electrode or the drain electrode of the TFT and a process of forming the pixel definition layer defining the light emission area of the pixel electrode are not required. Therefore, the structure of the device and processes of forming the device can be simplified.

In addition, when the opening for defining the pixel electrode is formed in the gate insulating layer using the laser ablation method, the LITI method, or the inkjet method according to the present invention, a photolithography process for forming the opening in the conventional art is not performed. Accordingly, remnants of a photosensitive material do not remain, and thus a defective pattern can be prevented.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A flat panel display apparatus, comprising:
   a substrate;
   a source electrode and a drain electrode formed in immediate and direct contact with on the substrate;
   a semiconductor layer formed to be in immediate and direct contact with the source electrode and the drain electrode;
   a pixel electrode formed immediately on the substrate to be in direct contact with one of the source and drain electrodes;
   an insulating layer formed to be in immediate and direct contact with the semiconductor layer and the pixel electrode, and having an opening exposing a portion of the pixel electrode; and
   a gate formed in immediate and direct contact with a portion of the insulating layer.

2. The flat panel display apparatus of claim 1, wherein the semiconductor layer includes an organic semiconductor material, the source electrode and the drain electrode being formed of different materials from each other, and wherein the pixel electrode extending from one of the source electrode and the drain electrode is formed of the same material as said one of the source electrode and the drain electrode.

3. The flat panel display apparatus of claim 2, wherein said one of the source electrode and the drain electrode is one of a transparent electrode formed of a material selected from the group consisting of indium tin oxide (ITO), indium zinc oxide (IZO), ZnO, and In$_2$O$_3$, and a reflective electrode including a stacked layer formed of a reflective material selected from the group consisting of Ag, Mg, Al, Pt, Pd, Au, Ni, Nd, k, Cr and compounds thereof, and a transparent conductive material selected from the group consisting of ITO, IZO, ZnO, and In$_2$O$_3$.

4. The flat panel display apparatus of claim 3, wherein another of the source electrode and the drain electrode is formed of a conductive material selected from the group consisting of Au, Pd, and Pt and having a work function higher than a work function of the semiconductor layer.

5. The flat panel display apparatus of claim 1, wherein the semiconductor layer is formed of an organic semiconductor material, and the pixel electrode is connected to one of the source electrode and the drain electrode and is formed of a material different from a material of the source electrode and the drain electrode.

6. The flat panel display apparatus of claim 5, wherein the source electrode and the drain electrode are formed of an electrode material selected from the group consisting of Au, Pd, and Pt and having a work function higher than a work function of the semiconductor layer.

7. The flat panel display apparatus of claim 5, wherein the pixel electrode is one of a transparent electrode formed of a material selected from the group consisting of indium tin oxide (ITO), indium zinc oxide (IZO), ZnO, and In$_2$O$_3$, and a reflective electrode including a stacked layer formed of a reflective material selected from the group consisting of Ag, Mg, Al, Pt, Pd, Au, Ni, Nd, Ir, Cr and a compound thereof, and a transparent conductive material selected from the group consisting of ITO, IZO, ZnO, and In$_2$O$_3$.

8. The flat panel display apparatus of claim 1, wherein the semiconductor layer is formed of an organic semiconductor material, the source electrode and the drain electrode being formed of different materials from each other, and wherein the pixel electrode comprises:

a reflective layer extending from one of the source electrode and the drain electrode; and a transparent electrode layer overlapping the reflective layer.

9. The flat panel display apparatus of claim 8, wherein the reflective layer of the pixel electrode and one of the source electrode and the drain electrode are formed of a material selected from the group consisting of Ag, Mg, Al, Pt, Pd, Au, Ni, Nd, Ir, Cr, and a compound of these materials, and wherein the transparent electrode layer is formed of a material selected from the group consisting of ITO, IZO, ZnO, and In$_2$O$_3$.

10. The flat panel display apparatus of claim 8, wherein another of the source electrode and the drain electrode is formed of a conductive material selected from the group consisting of Au, Pd, Pt, MoW oxide, and polyethylenedioxythiophene (PEDOT and having a work function higher than a work function of the semiconductor layer.

11. The flat panel display apparatus of claim 1, wherein the insulating layer is one of an organic insulating layer, an inorganic insulating layer and an organic-inorganic hybrid layer, and the insulating layer is formed as one of a single layer and a multi-layer.

12. The flat panel display apparatus of claim 1, wherein the insulating layer is formed of a material selected from the group consisting of SIO$_2$, SiNx, AL$_2$O$_3$, Ta$_2$O$_5$, BST PZT, PS(polystyrene), a phenol-based polymer, an acryl-based polymer, an imide-based polymer such as polyimide, an arylether-based polymer, an amide-based polymer, a fluoride-based polymer, a p-xylene based polymer, a vinyl alcohol-based polymer, and parylene.

13. The flat panel display apparatus of claim 1, wherein the insulating layer absorbs a laser beam, and is formed of a material selected from the group consisting of SiO2, polyimide, poly vinyl phenol (PVP), parylene, and PI/Al$_2$O$_3$.

14. The flat panel display apparatus of claim 1, wherein the insulating layer is formed of:

a material selected from the group consisting of polyvinyl alcohol (PVA), polyvinyl chloride (PVC), poly methylmethacrylate (PMMA), and a fluoride-based polymer material; and one of a chromophore having a band for absorbing a laser beam wavelength and a material which is a copolymer.

15. The flat panel display apparatus of claim 14, wherein the insulating layer contains 0.005 wt % of the chromophore.

16. The flat panel display apparatus of claim 1, wherein the insulating layer is formed of a material which can be formed using an inkjet method, and is selected from the group consisting of PI/Al$_2$O$_3$, polyimide, poly vinyl phenol (PVP), parylene, polyvinyl alcohol (PVA), polyvinyl chloride (PVC), poly methylmethacrylate (PMMA).

17. The flat panel display apparatus of claim 1, wherein the insulating layer is formed of a material which can be transferred by laser, and the material is obtained by mixing one of at least two kinds of polymers, and a low-molecular material and a polymer.

18. The flat panel display apparatus of claim 17, wherein the polymer is one of polyimide, poly vinyl phenol (PVP), parylene, polyvinyl alcohol (PVA), polyvinyl chloride (PVC), polymethylmethacrylate (PMMA), parylene, and polystyrene, and the low-molecular material is one of zirconia and alumina.

19. The flat panel display apparatus of claim 17, wherein the polymer and the low-molecular material are mixed at a ratio of 1:1-1:3.

20. The flat panel display apparatus of claim 17, wherein a sum of thicknesses of the semiconductor layer and the source and drain electrodes is less than 5000 Å.

21. The flat panel display apparatus of claim 20, wherein the sum of the thicknesses of the semiconductor layer and the source and drain electrodes is in a range of 2000-3000 Å.

22. The flat panel display apparatus of claim 1, further comprising:

a plurality of gate lines and a plurality of data lines crossing each other on the substrate; and a plurality of pixel regions defined by the plurality of gate lines and the plurality of data lines;

wherein each of the pixel regions comprises a thin film transistor (TFT) including the source and drain electrodes, the semiconductor layer and the gate, wherein the pixel electrode is connected to one of the source electrode and the drain electrode of the TFT, and wherein the openings of the insulating layer are arranged to form a mesh exposing a part of the pixel electrode in each of the pixel regions in lines parallel to one of the gate lines and the data lines so as to expose part of the pixel electrode in each of the pixel regions.

* * * * *